United States Patent
Matsunaga et al.

(10) Patent No.: US 7,973,907 B2
(45) Date of Patent: Jul. 5, 2011

(54) METHOD FOR TREATING SUBSTRATE, METHOD FOR CONVEYING SUBSTRATE, AND APPARATUS FOR CONVEYING SUBSTRATE

(75) Inventors: Kentaro Matsunaga, Kanagawa-ken (JP); Daisuke Kawamura, Chiba-ken (JP); Seiro Miyoshi, Kanagawa-ken (JP); Eishi Shiobara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 12/261,596

(22) Filed: Oct. 30, 2008

(65) Prior Publication Data
US 2009/0115978 A1    May 7, 2009

(30) Foreign Application Priority Data
Oct. 30, 2007   (JP) .................. 2007-282374

(51) Int. Cl.
*G03B 27/52*    (2006.01)
(52) U.S. Cl. .......................................................... 355/30
(58) Field of Classification Search .................. 355/27, 355/30, 53, 72; 396/611, 627; 118/52, 66; 430/311; 378/34
See application file for complete search history.

(56) References Cited

U.S. PATENT DOCUMENTS

| | | | |
|---|---|---|---|
| 6,087,076 A * | 7/2000 | Sakai et al. ................... 430/327 |
| 6,420,098 B1 * | 7/2002 | Mautz ........................... 430/313 |
| 6,444,029 B1 * | 9/2002 | Kimura et al. ................... 118/52 |
| 6,558,053 B2 * | 5/2003 | Shigemori et al. ............. 396/611 |
| 6,781,685 B2 * | 8/2004 | Hamm ........................ 356/237.1 |
| 6,844,027 B1 * | 1/2005 | Gurer et al. .................... 427/240 |
| 7,248,332 B2 * | 7/2007 | Owen ............................. 355/30 |
| 2005/0008864 A1 * | 1/2005 | Ingen Schenau et al. .. 428/411.1 |
| 2005/0054217 A1 * | 3/2005 | Klomp et al. .................. 438/795 |
| 2007/0199579 A1 * | 8/2007 | Hayasaki et al. ................. 134/2 |
| 2008/0020324 A1 * | 1/2008 | Shiu et al. ...................... 430/311 |
| 2008/0078427 A1 * | 4/2008 | Matsunaga ..................... 134/33 |

FOREIGN PATENT DOCUMENTS

| JP | 2002-261001 | * | 9/2002 |
| JP | 2004-348133 | | 12/2004 |
| JP | 2005-268358 | | 9/2005 |
| JP | 2005-268385 | * | 9/2005 |
| JP | 2006-032957 | * | 2/2006 |
| JP | 2006-32957 | | 2/2006 |

OTHER PUBLICATIONS

English Translation of JP 2005-268358 (dated Sep. 29, 2005).*

* cited by examiner

*Primary Examiner* — Peter B Kim
*Assistant Examiner* — Chia-how Michael Liu
(74) *Attorney, Agent, or Firm* — Finnegan, Henderson, Farabow, Garrett & Dunner, L.L.P.

(57) ABSTRACT

A method for treating a substrate before exposing the substrate to which a resist is applied, includes, rinsing the substrate to which a resist is applied, and holding the rinsed substrate in an atmosphere. The atmosphere substantially contains no moisture until conveying the substrate to an exposure apparatus.

17 Claims, 15 Drawing Sheets

METHOD FOR TREATING SUBSTRATE, METHOD FOR CONVEYING SUBSTRATE, AND APPARATUS FOR CONVEYING SUBSTRATE

CROSS-REFERENCE TO RELATED APPLICATIONS

This application is based upon and claims the benefit of priority from the prior Japanese Patent Application No. 2007-282374, filed on Oct. 30, 2007; the entire contents of which are incorporated herein by reference.

BACKGROUND OF THE INVENTION

1. Field of the Invention

This invention relates to a method for treating a substrate, a method for conveying a substrate, and an apparatus for conveying a substrate which are used for lithography process or the like in semiconductor device production.

2. Background Art

In a semiconductor lithography technique, as the pattern structure is finer, fine pattern exposure using extreme ultraviolet (EUV) light near 13.5 nm has been developed.

The EUV light has intensive attenuation in an air, and damage is caused in an optical system by active species generated by moisture excited in an atmosphere, and therefore, the exposure is performed in high vacuum of, for example, the vicinity of $10^{-5}$ Pa (pascal).

Moreover, because it has been estimated that the apparatus price of the EUV exposure apparatus becomes very high, high throughput such as 100 wafers per hour in a substrate (wafer) having a diameter of 300 mm is required for the EUV exposure apparatus. Therefore, it is necessary that conveyance of substrate into the EUV exposure apparatus and adjustment of atmospheric pressure in the exposure apparatus along therewith are performed at high speed.

On the other hand, along with conveying the substrate from an application development apparatus or the like to the inside of the exposure apparatus, the degree of vacuum of the inside of the exposure apparatus is shifted, and thereby, temperature changes inside the exposure apparatus and of the substrate and additional humidity change are caused. For ensuring adjustment accuracy and focus accuracy in the exposure that are required for a fine pattern to be formed by the EUV exposure apparatus, it is necessary to suppress the above-described fluctuation of the degree of vacuum and the humidity.

The most simple method for suppressing the pressure change is to control the degree of vacuum (and humidity) inside an interface for conveying the pre-exposure substrate into the exposure apparatus to be equal to that of the inside of the exposure apparatus, and then, to carry the pre-exposure substrate into the exposure apparatus, and to carry the substrate out of the exposure apparatus to the interface.

However, it is difficult in a conventional interface structure to maintain the high throughput with adapting the pressure of the interface to that of the inside of the exposure apparatus.

In a lithography process by EUV light, after subjecting the substrate to be processed to application of resist material and bake treatment and cooling treatment at room temperature (treatment for cooling temperature) in an application and development apparatus, the substrate on which the resist film is formed is stored in a buffer and the exposure is waited for. The pre-exposure substrate is conveyed from the application and development apparatus into the exposure apparatus by the interface, and subjected to exposure treatment on an exposure stage in the exposure apparatus, and then, conveyed into the application and development apparatus again, and subjected to post-exposure bake treatment, cooling treatment (temperature-lowering treatment), and development treatment, and thereby, a resist pattern is formed.

When the substrate to which a resist material is applied is put into the vacuum chamber containing the exposure stage and exposed, occasionally, foreign material attached onto the resist surface fries to cause contamination of, inner wall in the vacuum chamber, light path, or mirror. In many cases, the foreign matter is organic matter, but if the substance thereof contaminates the chamber or the light path or the mirror, illuminance of EUV light lowers and the throughput lowers, or aberration is caused and lowering of resolution performance is caused.

If chamber or light path or mirror or exposure stage in the vacuum regions in the exposure apparatus is contaminated, it becomes necessary that the vacuum is once released and the maintenance such as cleaning or component replacement is performed, and therefore, the downtime of the exposure apparatus becomes long, and the contamination becomes a factor of pushing up the cost of the semiconductor device production.

Moreover, if moisture is attached to the substrate to which the resist is applied, there are caused the problems that the degree of vacuum of the vacuum chamber into which the exposure stage is placed fluctuates to lower the throughput because the exposure cannot be performed for the time in which the degree of vacuum is being stabilized and that the water molecule in the vacuum chamber is irradiated with EUV light to be ionized and the performance of parts are degraded if the ionized water molecule attaches to the exposure apparatus again.

Therefore, it is necessary to administer the moisture attaching to the pre-exposure substrate to be a low moisture amount.

A technique for detecting contamination in the EUV exposure apparatus and cleansing the contamination is disclosed in JP-A 2002-261001 (Kokai), and a technique for lowering contamination by applying charge attracting particles in the exposure apparatus is disclosed in JP-A 2006-32957 (Kokai), and a technique for cleaning up a mirror in the EUV apparatus is disclosed in JP-A 2005-268358 (Kokai). However, in every one of the techniques, an apparatus enabling a special rinsing method in the exposure apparatus is required in the exposure apparatus, and therefore, such an apparatus becomes a factor pushing up the apparatus price.

Moreover, a technique for solving the problem by applying a top coat onto the resist for preventing the illuminance from being degraded due to generation of moisture in irradiating the resist with the EUV light and attachment of the moisture to the mirror is disclosed in JP A-2004-348133 (Kokai), but because a protective film is formed by CVD deposition, there are problems that the process cost is pushed up and that the time for pulling and putting the substrate after the resist application becomes long and that the performance of the resist is degraded by CVD deposition film and so forth.

SUMMARY OF THE INVENTION

According to an aspect of the invention, there is provided a method for treating a substrate before exposing the substrate to which a resist is applied, including, rinsing the substrate to which a resist is applied; and holding the rinsed substrate in an atmosphere substantially containing no moisture until conveying the substrate to an exposure apparatus.

According to another aspect of the invention, there is provided a substrate-conveying apparatus having a conveyance pathway connected to an exposure apparatus, wherein the conveyance pathway for carrying the substrate into the exposure apparatus in the conveyance pathway is composed by serially connecting a plurality of conveyance chambers in which degree of vacuum becomes high in a stepwise manner to the exposure apparatus side, and at least a part of the conveyance pathway to the exposure apparatus is a plurality of pathways by setting at least one of the plurality of conveyance chambers to be a plurality of compartments arranged in parallel.

DETAILED DESCRIPTION OF THE INVENTION

Hereinafter, embodiments of the invention will be explained with reference to drawings.

Following first to third embodiments of the invention are to apply a resist material to a substrate in an application and development apparatus and then to cleanse the substrate to have no moisture, no foreign matter, and no sublimated matter and then to convey the substrate to the exposure apparatus.

Further specifically, in a resist-film-forming step in a semiconductor lithography process, after application of a resist material to a substrate to be processed, the substance becoming detached from the application film or from the substrate in the exposure apparatus and contaminating the optical system such as lens or mirror of the exposure apparatus is removed.

The specific substance to be removed is thought to include dust, water, resist thinner, acid-generating agent, acid-inactivating agent, hydrocarbon, carbon fluoride, low-molecular siloxane, ring-like siloxane, hexamethyldisilazane, thermal cross-linking agent, detergent, ammonium, amine, hydrogen, nitrogen, argon, carbon monoxide, carbon dioxide, and decomposed matters thereof.

And, the substrate is continuously held in an environment maintained to be an atmosphere whose humidity is very low, and the substrate is conveyed in a clean environment in which substance contaminating the exposure apparatus does not attach thereto, and the substrate is introduced into the exposure apparatus.

First Embodiment

The following first embodiment of the invention is to subject the substrate to temperature-lowering treatment under an environment of extreme low humidity after calcination treatment (bake treatment) as removing the foreign matter.

Figure 1:
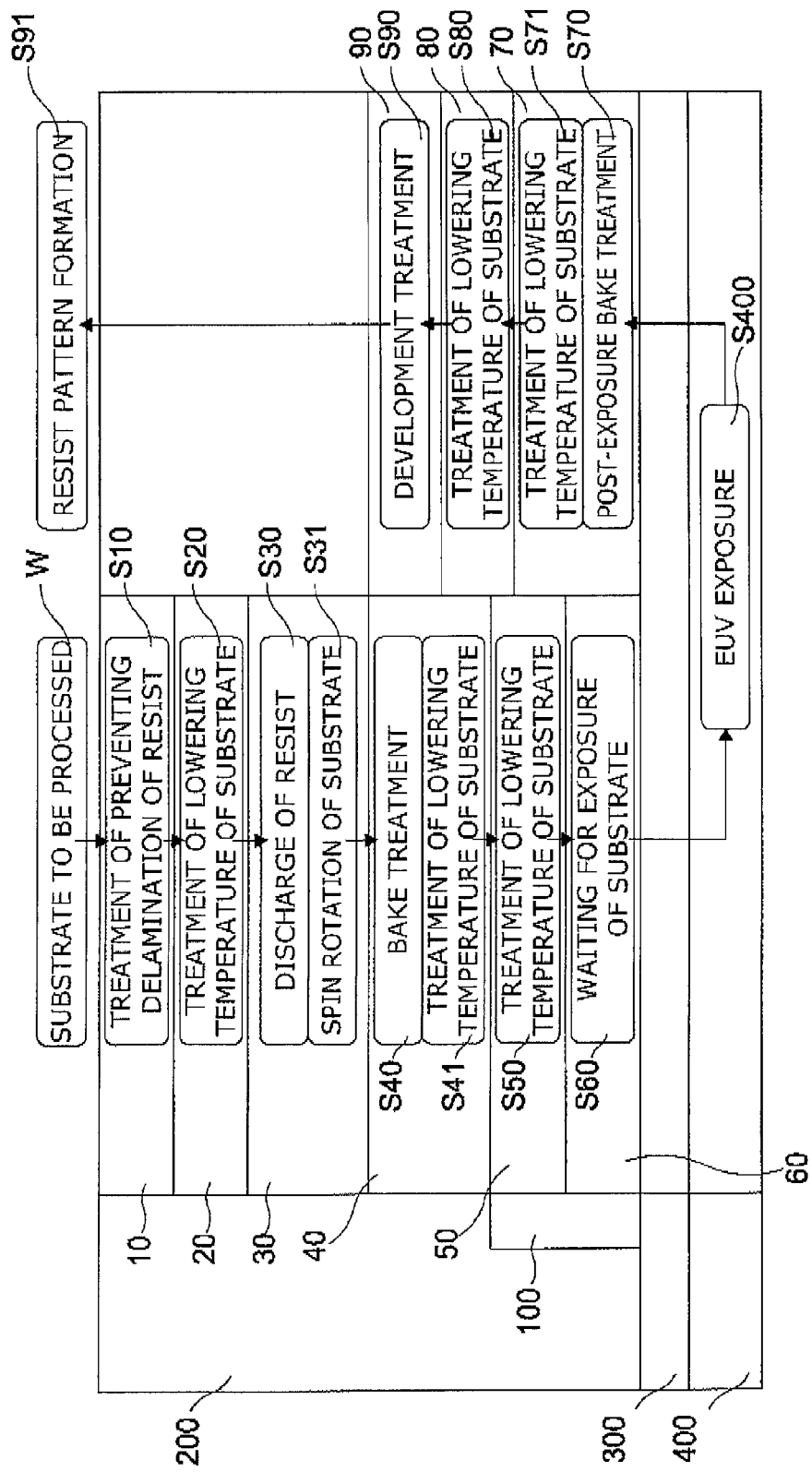
FIG. 1 is a schematic view for explaining a structure and a treatment procedure of a lithography system according to a first embodiment of the invention.

FIG. 1 is a schematic view for explaining a structure and a treatment procedure of a lithography system according to the first embodiment of the invention. With respect to each of the drawings after FIG. 1, the same signs are appended to the same component as explained with respect to a previous drawing, and detailed explanation thereof will be omitted.

The lithography system is composed of an application and development apparatus 200, an interface (conveyance apparatus) 300, and an EUV exposure apparatus 400.

The application and development apparatus 200 includes an adhesion unit 10, a substrate-cooling unit 20, a resist-applying unit 30, a bake unit 40, a substrate-cooling unit 50, a buffer 60, a bake unit 70, a substrate-cooling unit 80, development unit, and a temperature and humidity controlling apparatus 100.

Figure 2:
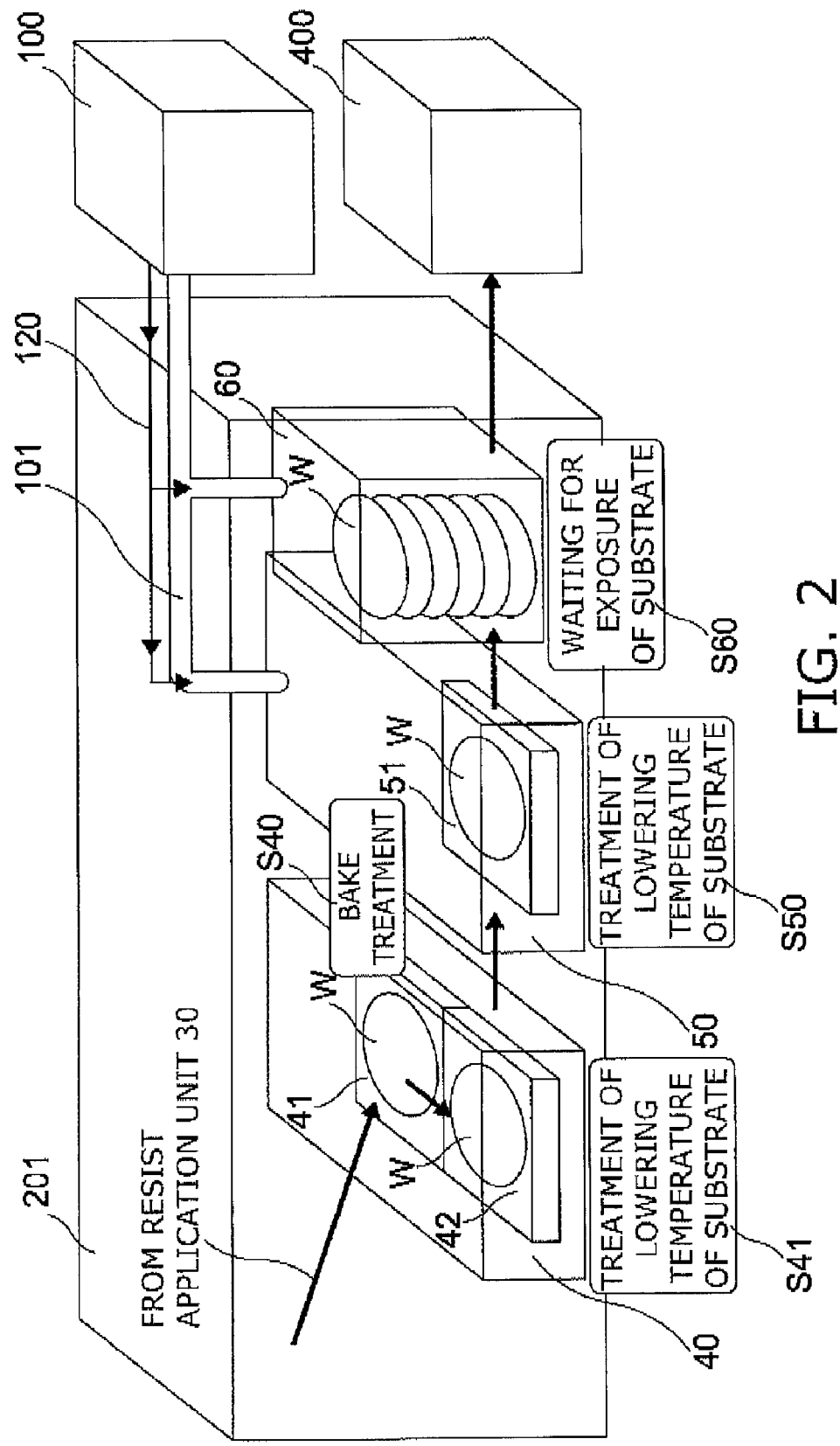
FIG. 2 is a schematic view showing a structure of a substrate-treating apparatus in the application and development apparatus 200 of FIG. 1.

FIG. 2 is a schematic view showing a structure of a substrate-treating apparatus in the application and development apparatus 200 of FIG. 1.

In FIG. 2, a substrate-treating apparatus 201 includes the bake unit 40, the substrate-cooling unit 50, the buffer 60 and the temperature and humidity controlling apparatus 100. The temperature and humidity controlling apparatus 100 supplies dry air (clean air) 102 of extremely low humidity substantially having no moisture to the substrate-cooling unit 50 and the buffer 60 through a duct 101, and inside of the substrate-cooling unit 50 and the buffer 60 is maintained to be the atmosphere of extremely low humidity.

Figure 3:
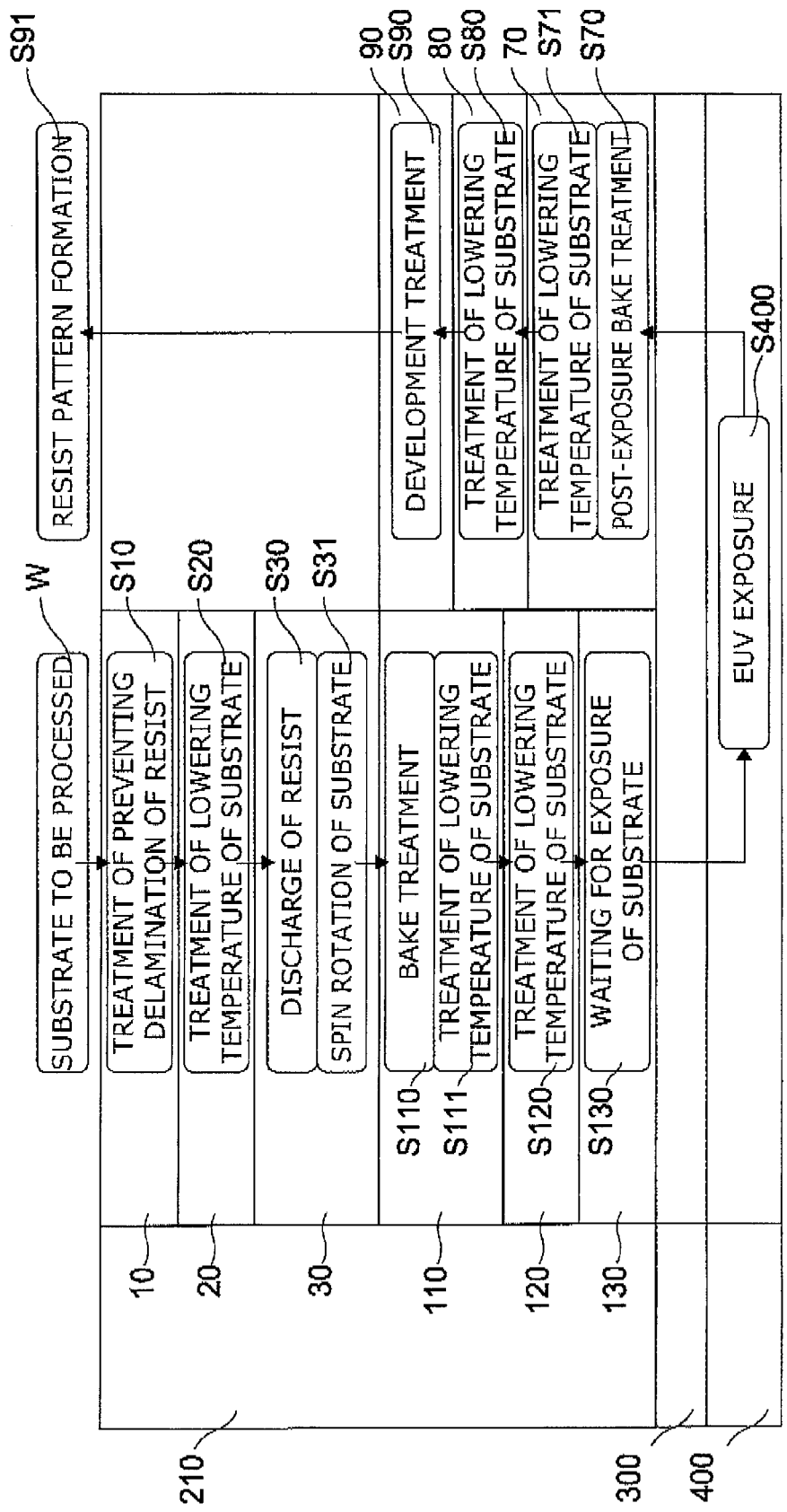
FIG. 3 is a schematic view for explaining a structure and a treatment procedure of a lithography system according to a first comparative example.

On the other hand, FIG. 3 is a schematic view for explaining a structure and a treatment procedure of a lithography system according to a first comparative example.

In the application and development apparatus 200 of FIG. 1, this application and development apparatus 210 of the first comparative example is not provided with the temperature and humidity controlling apparatus 100, and the bake unit 40, the substrate-cooling unit 50, and the buffer 60 are a bake unit 110, a substrate-cooling unit 120, and a buffer 130 which perform treatments under a clean air of 40% humidity, respectively.

The treatment contents (S110, S111, S120, S130) in the bake unit 110, the substrate-cooling unit 120, and the buffer 130 are the same as the treatment contents (S40, S41, S50, S60) in the bake unit 40, the substrate-cooling unit 50, and the buffer 60, respectively.

On the other hand, in the comparative example, the bake unit 110 and the substrate-cooling unit 120 and the buffer 130 perform the treatments under an environment of clean air of 40% humidity, and by contrast, this embodiment is different in the point that the substrate-cooling unit 50 and buffer 60 perform the treatments under an environment of clean air (dry air) of extreme low humidity.

Hereinafter, the treatment procedure of the substrates to be processed (substrate and semiconductor wafer) in FIGS. 1 and 2 will be explained.

First, in the adhesion unit 10, a substrate to be processed (W) is subjected, for example, for 30 seconds to an HMDS vapor atmosphere heated to, for example, 100° C., and thereby, treatment of preventing delamination of resist is performed (S10). Then, in the substrate-cooling unit 20, the substrate (W) is subjected to cooling treatment (temperature-lowering treatment) to room temperature (S20).

Next, the substrate is conveyed into the resist-applying unit 30, and, for example, 10 cc of resist is discharged on the substrate (S30) and applied to be a film thickness of 60 nm by performing spin-rotation, for example, at 1500 rpm (S31).

The resist-applying unit 30 adjusts its environment by clean air, and temperature of the clean air is 23° C. and humidity thereof is 40%.

Next, the substrate is conveyed to the bake unit 40, and subjected to calcination treatment (bake treatment) under the condition of, for example, 110° C. for 60 seconds on a hot plate 41 (S40), and thereby, the solvent in the resist is evaporated, and then, the substrate is transferred onto a cooling plate 42 and subjected to temperature lowering treatment (S41).

Furthermore, the substrate is moved to the substrate-cooling unit 50, and transferred onto a cooling plate 51 and subjected to temperature lowering treatment (cooling treatment) in the substrate-cooling unit 50 under the environment held to be of extremely low humidity (S50).

By performing the bake treatment (S40), the moisture contained in the resist can be effectively evaporated, and furthermore, the substance detached from the substrate or from the resist film (resist thinner, acid-generating agent, acid-inactivating agent, hydrocarbon, carbon fluoride, low-molecular siloxane, ring-like siloxane, hexamethyldisilazane, thermal cross-linking agent, detergent, ammonium, amine, hydrogen, nitrogen, argon, carbon monoxide, carbon dioxide, and decomposed matters thereof) can be effectively removed.

If the baked substrate is cooled under high humidity, the substrate can be subjected to dew formation, but according to this embodiment, the dew formation can be prevented by cooling the substrate in the substrate-cooling unit 50 under the extremely low humidity environment.

Next, the substrate is moved under the environment held to be of extreme low humidity, and stored in the buffer 60 under the environment held to be of extreme low humidity in the same manner, and the exposure is waited for (S60).

As described above, by holding the substrate under the environment held to be of extreme low humidity, the dew formation on the substrate can be prevented and the cleanup state can be held.

The substrate on which a photoresist film is formed that is stored in the buffer 60 is conveyed by the interface 300 to an anterior chamber of the EUV exposure apparatus 400. And, the substrate is put under vacuum in the anterior chamber of the EUV exposure apparatus 400, and then, moved to the exposure stage and subjected to the EUV exposure (S400).

Because the substrate is administered under the extreme low humidity before the exposure, by conveying the substrate in such a clean environment as having no attachment of substance contaminating the exposure apparatus, this substrate can be exposed without generating a factor of changing aberration of the exposure apparatus and a factor of causing lowering of illuminance of EUV light, such as change of degree of vacuum and contamination in the exposure apparatus.

The exposed substrate is transferred to a posterior chamber of the EUV exposure apparatus 400, and the posterior chamber is returned to be under normal pressure from the vacuum, and then, immediately, the substrate is conveyed to the bake unit 70 of the application and development apparatus 200 by the interface 300 for performing the post-exposure bake treatment.

And, in the bake unit 70, the post-exposure bake treatment is performed under the condition of, for example, 120° C. for 60 seconds (S70), and then, the temperature-lowering treatment is performed (S71), and furthermore, the substrate is conveyed to the substrate-cooling unit 80 and subjected to temperature-lowering treatment (cooling treatment) (S80).

Next, the substrate is transferred to the development unit 90 and subjected to development treatment with a development solution composed of 2.38% by weight of a tetramethylammonium hydroxide (TMAH) aqueous solution (S90), and thereby, the resist pattern is formed (S91).

According to the above-described first embodiment, the substrate to which resist is applied is cleaned up to be the substrate in which moisture, foreign matter, and sublimated matter are removed by performing temperature-lowering treatment under an environment of extremely low humidity after the bake, and then, the substrate conveyed to the EUV exposure apparatus, and thereby, progress of contamination in the exposure apparatus can be lowered to hold the atmosphere in the exposure apparatus to be clean. As a result, downtime of the exposure apparatus can be reduced, and therefore, the production cost of the semiconductor device can be lowered.

Furthermore, by adjusting the environment of the temperature and humidity after cleaning up the substrate to have no moisture and no foreign matter and no sublimated matter, progress of contamination of exposure stage, chamber, mirror and light path of the EUV exposure apparatus can be lowered.

Second Embodiment

In the following second embodiment of the invention, as removing foreign matter, the substrate on which the resist film is formed is rinsed to remove the foreign matter on the surface of the substrate, and then, the substrate is subjected to calcination treatment (bake treatment) to remove the substance detached from the substrate or from the resist film.

Figure 4:
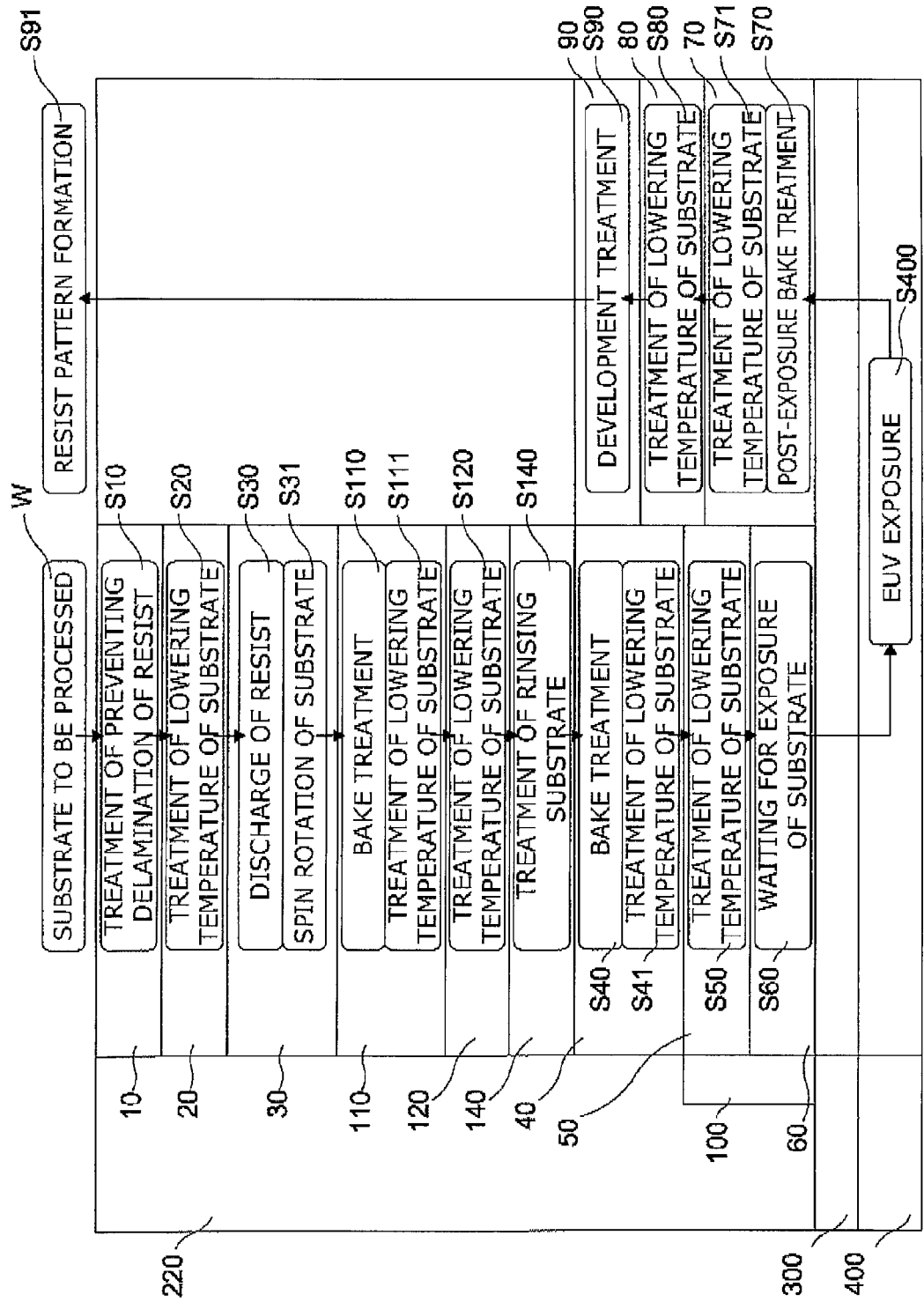
FIG. 4 is a schematic view for explaining a structure and a treatment procedure of a lithography system according to a second embodiment of the invention.

FIG. 4 is a schematic view for explaining a structure and a treatment procedure of a lithography system according to the second embodiment of this invention.

The lithography system of FIG. 4 is composed of an application and development apparatus 220, the interface (conveyance apparatus) 300, and the EUV exposure apparatus 400.

The application and development apparatus 220 includes the adhesion unit 10, the substrate-cooling unit 20, the resist-applying unit 30, the bake unit 110, the substrate-cooling unit 120, a substrate-rinsing unit 140, the bake unit 40, the substrate-cooling unit 50, the buffer 60, the bake unit 70, the substrate-cooling unit 80, the development unit 90, and the temperature and humidity controlling unit 100.

Figure 5:
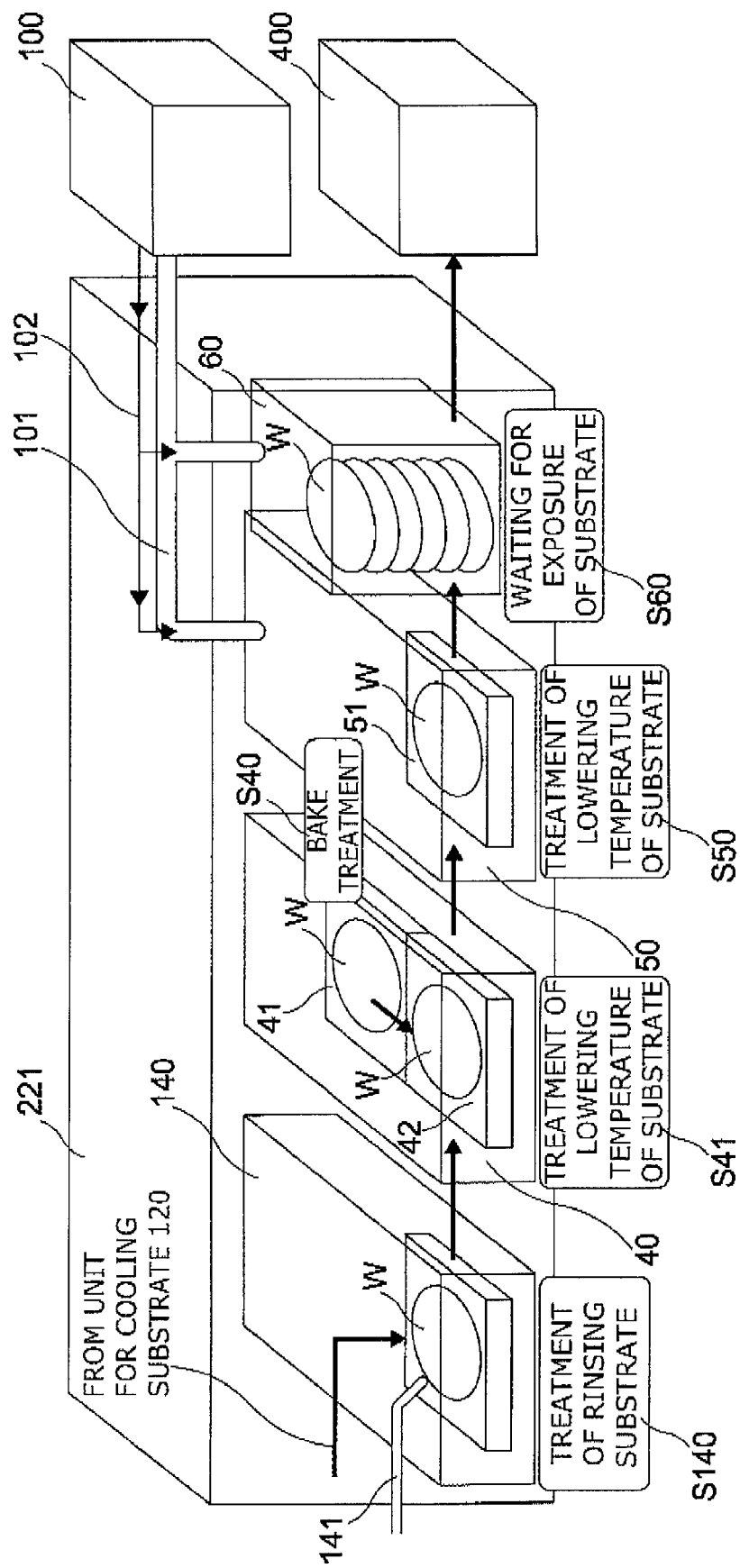
FIG. 5 is a schematic view showing a structure of a substrate-treating apparatus in the application and development apparatus 220 of FIG. 4.

FIG. 5 is a schematic view showing a structure of a substrate-treating apparatus in the application and development apparatus 220 of FIG. 4. In FIG. 5, the substrate-treating apparatus 221 includes the substrate-rinsing unit 140, the bake unit 40, the substrate-cooling unit 50, the buffer 60, and the temperature and humidity controlling apparatus 100. The substrate-treating apparatus 221 has a structure in which the substrate-rinsing unit 140 is provided in the substrate-treating apparatus 201 (see, FIG. 2) of the first embodiment.

Hereinafter, the treatment procedure of substrate to be processed (substrate, semiconductor wafer) in FIGS. 4 and 5 will be explained This embodiment is the same as the first embodiment (see, FIG. 1) until a substrate to be processed (W) is subjected to resist-applying treatment (S30, S31) in the resist-applying unit 30, and is the same as the first comparative example (see FIG. 3) until the treatment of lowering temperature of the substrate (S120) is performed in the substrate-cooling unit 120.

While the substrate (W) is subjected to calcination treatment (bake treatment) under the condition of, for example, 110° C. for 60 seconds in the bake unit 110 (S110) and then the substrate is cooled (S111, S120), the humidity of the clean air is 40%, which is the same as the resist-applying unit 30.

Next, the substrate is transferred to the substrate-rinsing unit 140. In the substrate-rinsing unit 140, the substrate is rinsed (S140). As a rinse liquid (cleaning liquid) 141, for example, ultrapure water is used, and in order that drop of water is not left on the substrate, front surface, back surface, edge and bevel portion of the substrate are rinsed, and then, spin-dried by rotation, for example, at 1500 rpm.

As the rinse liquid, not only the ultrapure water but water containing detergent, hydrogen water, ozone water, ion water, detergent-added aqueous solution, fluorinated solvent (fluorinated inactive liquid) such as Galden ("Galden" is the trademark for certain perfluoropolymer) or Fluorinert ("Fluorinert" is the trademark for certain fully-fluorinated compounds), isopropyl alcohol, ethanol, methanol, and so forth can also be used.

The solvent in the resist evaporates in the bake treatment (S110) after the resist applications and volatile substance detached from the substrate or from the resist film can be made to fly, but the foreign matter and sublimated matter occasionally attach to the substrate again.

Accordingly, by rinsing front surface, back surface, edge and bevel portion of the substrate, the foreign matter, sublimated matter and further dust and so forth can be removed from the substrate.

Next, the rinsed substrate is transferred to the bake unit 40 and subjected to bake treatment under the condition of, for example, 100° C. for 60 seconds (S40), and subjected to temperature-lowering treatment (S41). Furthermore, the substrate is transferred to the substrate-cooling unit 50 held to be of extremely low humidity and subjected to temperature-lowering treatment (cooling treatment) (S50).

By the bake treatment (S40) after the rinse, the moisture attaching to the substrate completely evaporates, but if the baked substrate subjected to cooling after bake under high humidity, dew can be formed on the substrate.

Therefore, by the substrate-cooling unit 50 under an environment of extremely low humidity, the environment of an atmosphere in which the substrate is baked is replaced by the clean air (dry air) of extremely low humidity, and the baked substrate is cooled under an environment of extremely low humidity, and thereby dew formation can be prevented.

Next, the substrate is moved to be under an environment held to be of extremely low humidity, and stored into the buffer 60 under an environment held to be of extremely low humidity in the same manner, and the exposure is waited (S60). By holding the substrate under the environment held to be of extremely low humidity, dew formation on the substrate can be prevented and the cleanup state can be held.

After then, the resist pattern is formed in the same method as the first embodiment.

According to the above-described second embodiment, the substrate subjected to resist application, bake treatment and temperature-lowering treatment is rinsed to remove the foreign matter and the sublimated matter attaching or reattaching onto the surface of the substrate, and then, the moisture is removed by the bake treatment, and then, with maintaining the substrate to be clean under the environment of the extremely low humidity, the substrate is transferred to the EUV exposure apparatus, and thereby, progress of contamination in the exposure apparatus can be lowered to hold the atmosphere in the exposure apparatus to be clean.

Third Embodiment

Figure 6:
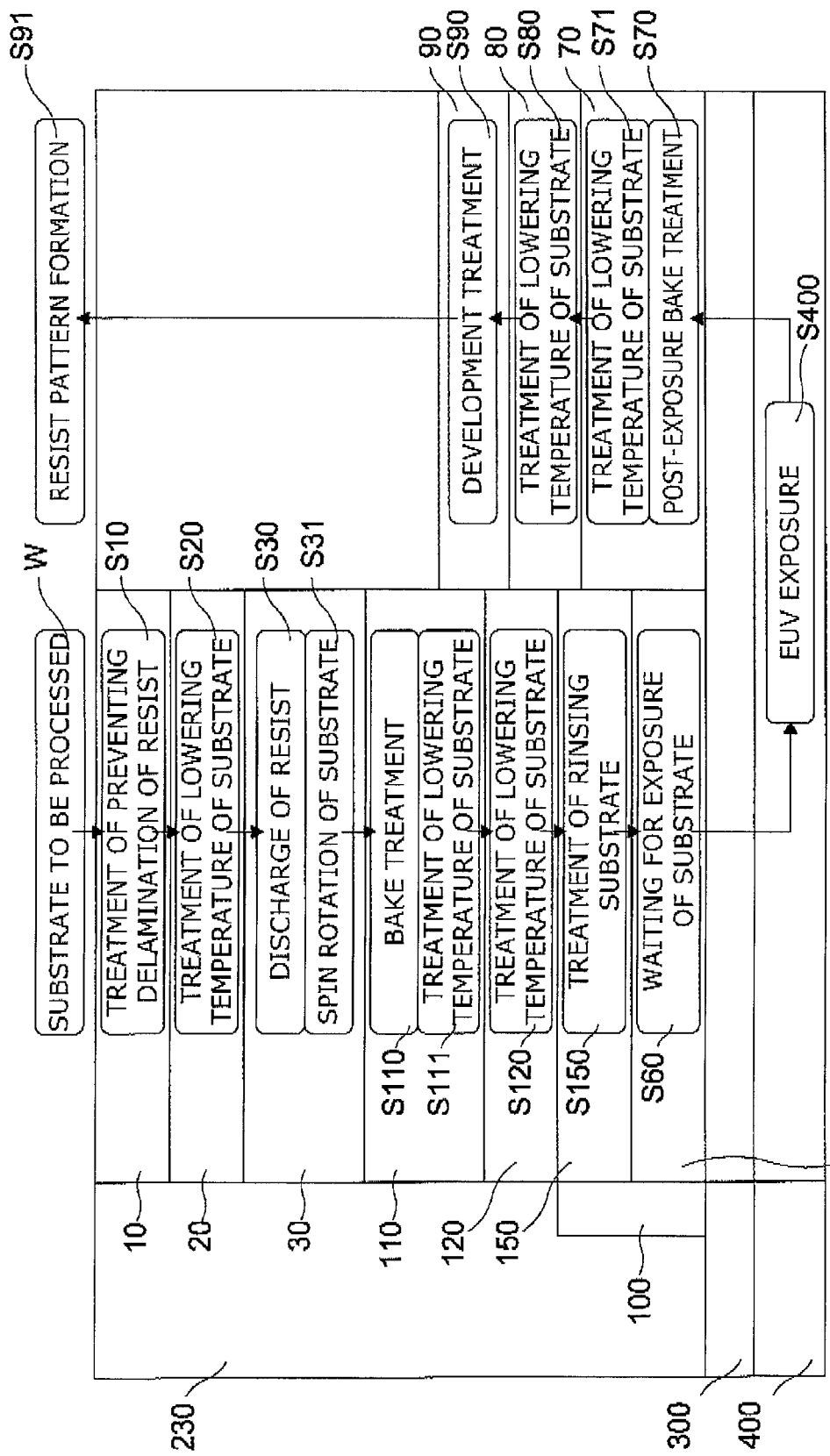
FIG. 6 is a schematic view for explaining a structure and a treatment procedure of a lithography system according to a third embodiment of the invention.

In the third embodiment of the invention, as removing the foreign matter, the substrate on which the resist film is formed is rinsed to remove the foreign matter on the surface of the substrate, and then, the substrate is spin-dried. FIG. 6 is a schematic view for explaining a structure and a treatment procedure of a lithography system according to the third embodiment of this invention.

The lithography system of FIG. 6 is composed of an application and development apparatus 230, the interface (conveyance apparatus) 300, and the EUV exposure apparatus 400.

The application and development apparatus 230 includes the adhesion unit 10, the substrate-cooling unit 20, the resist-application unit 30, the bake unit 110, the substrate-cooling unit 120, a substrate-rinsing unit 150, the buffer 60, the bake unit 70, the substrate-cooling unit 80, the development unit 90, and the temperature and humidity controlling apparatus 100.

Figure 7:
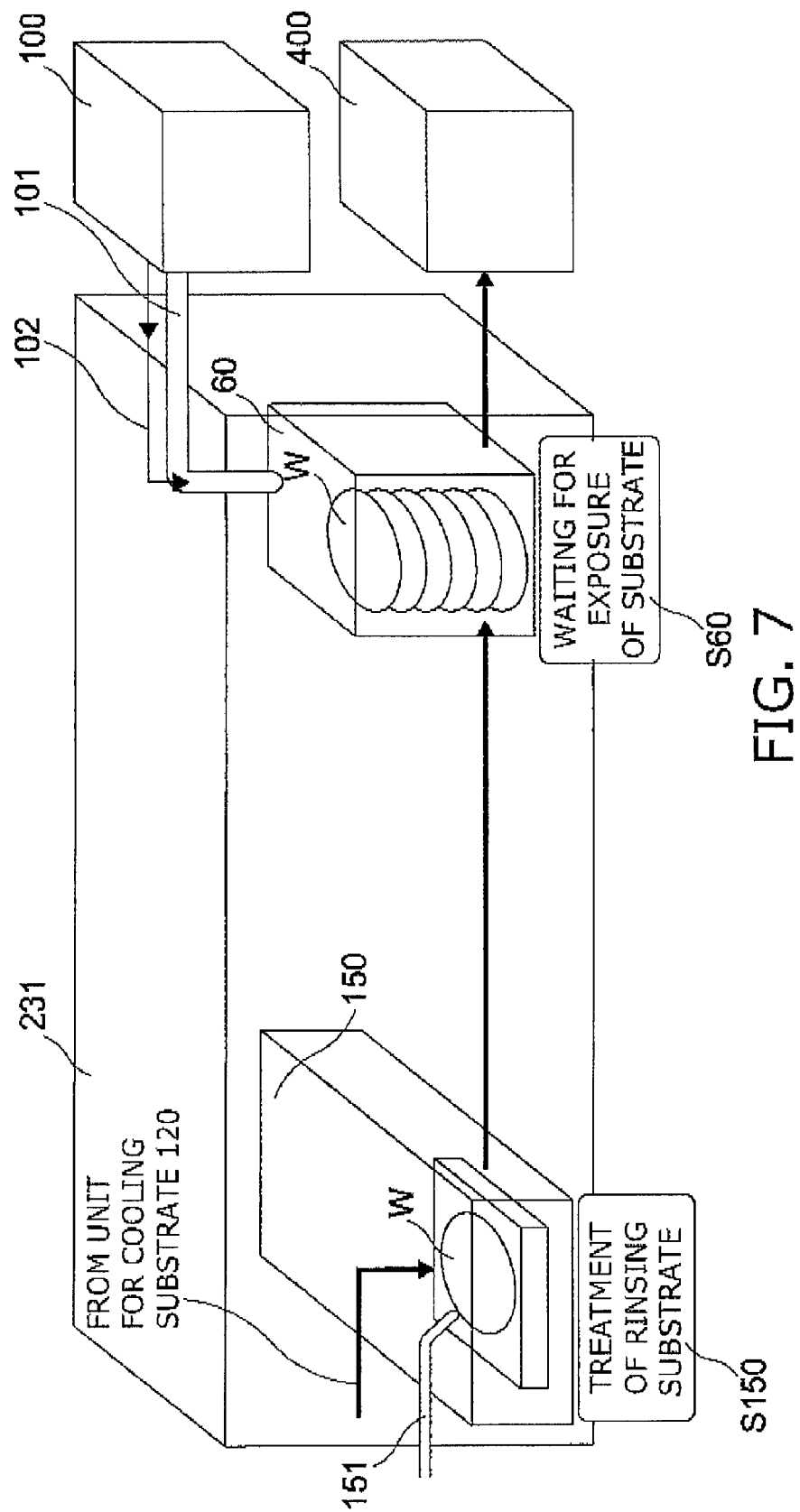
FIG. 7 is a schematic view showing a structure of a substrate-treating apparatus in the application and the development apparatus 230 of FIG. 6.

FIG. 7 is a schematic view showing a structure of a substrate-treating apparatus in the application and the development apparatus 230 of FIG. 6. In FIG. 7, the substrate-treating apparatus 231 includes the substrate-rinsing unit 150, the buffer 60, and the temperature and humidity controlling apparatus 100. The temperature and humidity apparatus 100 supplies dry air (clean air) 102 of extremely low humidity substantially having no moisture to the buffer 60 through a duct 101, and inside of the buffer 60 is maintained to be the atmosphere of extremely low humidity.

Hereinafter, the treatment procedure of substrates to be processed (substrate, semiconductor wafer) in FIGS. 6 and 7 will be explained.

This embodiment is the same as the second embodiment (see, FIG. 4) until a substrate to be processed (W) subjected to bake treatment after the resist application is subjected to the treatment of lowering temperature of the substrate (S120) in the substrate-cooling unit 120).

The substrate (W) subjected to the temperature-lowering treatment (S120) in the substrate-cooling unit 120 is transferred to the substrate-rinsing unit 150, and subjected to rinse treatment in the substrate-rinsing unit 150 (S150). As the rinse liquid (cleaning liquid) 151, for example, ultrapure water is used, and in order that drop of water is not left on the substrate, front surface, back surface, edge and bevel portion of the substrate are rinsed, and then, spin-dried by rotation, for example, at 1500 rpm.

As the rinse liquid, not only the ultrapure water but water containing detergent, hydrogen water, ozone water, ion water, detergent-added aqueous solution, fluorinated solvent (fluorinated inactive liquid) such as Galden ("Galden" is the trademark for certain perfluoropolymer) or Fluorinert ("Fluorinert" is the trademark for certain fully-fluorinated compounds), isopropyl alcohol, ethanol, methanol, and so forth can also be used.

As described above, by rinsing and spin-drying the substrate, the foreign matter and the sublimated matter attaching or reattaching onto the surface of the substrate, and therewith, the moisture attaching to the substrate can be completely evaporated. And then, if the substrate is held under the environment of extremely low humidity, the reattachment to the substrate can be prevented and the bake treatment after the rinse can be omitted.

That is, the substrate is moved under the environment held to be of extreme low humidity, and stored in the buffer 60 under the environment held to be of extreme low humidity in the same manner, and the exposure is waited for (S60). By holding the substrate under the environment held to be of extreme low humidity, the dew formation on the substrate can be prevented and the cleanup state can be held.

After then, the resist pattern is formed in the same method as the first embodiment.

According to third embodiment as described above, the substrate subjected to resist application, bake treatment and temperature-lowering treatment is rinsed and spin-dried to remove the foreign matter and the sublimated matter attaching or reattaching onto the surface of the substrate, and therewith, the moisture is removed, and then, by storing the substrate under an environment of extremely low humidity, the substrate is made to be clean, and then the substrate is transferred to the EUV exposure apparatus, and thereby, progress of contamination in the exposure apparatus can be lowered to hold the atmosphere in the exposure apparatus to be clean.

Fourth Embodiment

In following fourth to eighth embodiments of the invention, the interface (conveyance apparatus) for transferring the substrate to the EUV exposure apparatus is composed of many stages, and at least a part of the interface is composed of a plurality of pathways, and by the plurality of pathways, the substrates are distributed and transferred.

Figure 8:
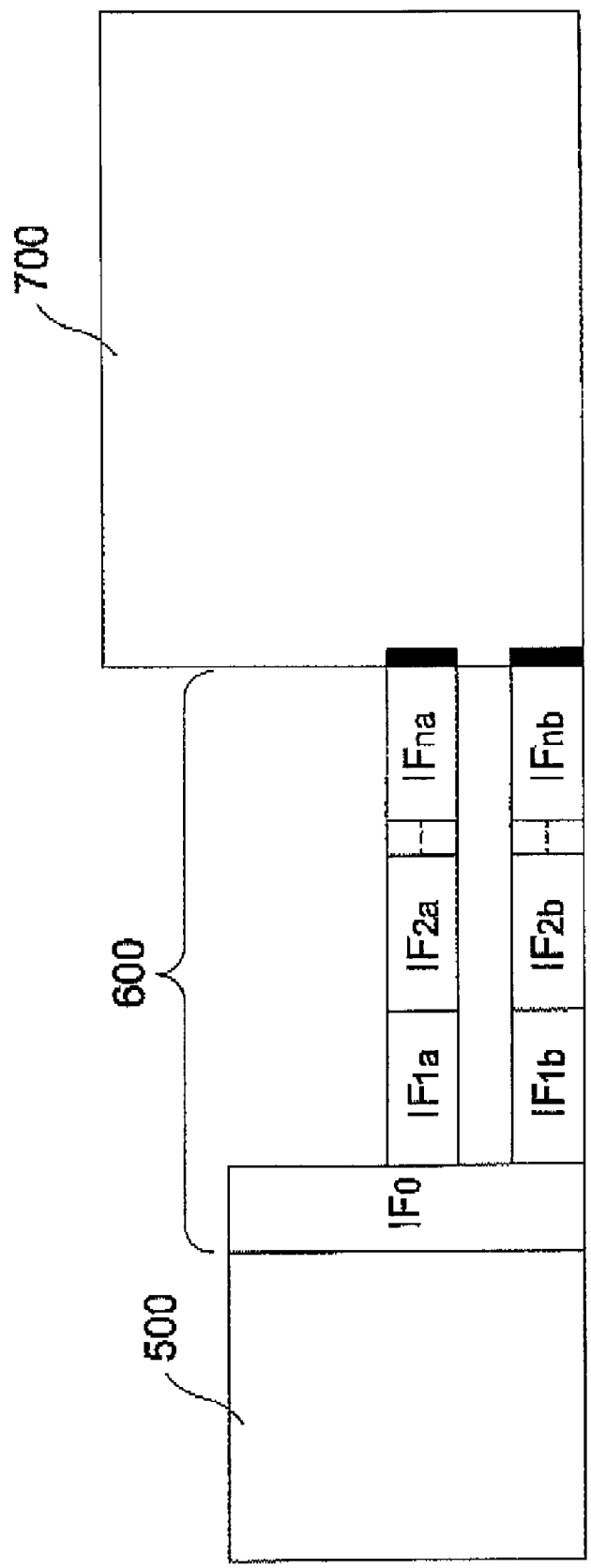
FIG. 8 is a schematic view for explaining a structure of a lithography system according to a fourth embodiment of the invention.

FIG. 8 is a schematic view for explaining a structure of a lithography system according to fourth embodiment of this invention. With respect to each of drawings after FIG. 8, the same signs are appended to the same components as explained with respect to a previous drawing, and the detailed explanation thereof will be omitted.

The lithography system of FIG. 8 is composed of, an application and development apparatus 500 for performing the treatment under atmosphere pressure, an interface (conveyance apparatus) 600, and an EUV exposure apparatus 700 for performing exposure treatment under high vacuum of, for example, $10^{-5}$ Pa.

The substrate (wafer) on which a photoresist film is formed in the application and development apparatus 500 is transported (conveyed) from the application and development apparatus 500 to the exposure apparatus 700 by the interface 600. This substrate is subjected to pattern exposure in the exposure apparatus 700, and then, transported from the exposure apparatus 700 to the application and development apparatus 500 by the interface 600 again, and subjected to development treatment in the application and development apparatus 500, and thereby the resist pattern is formed.

Figure 9:
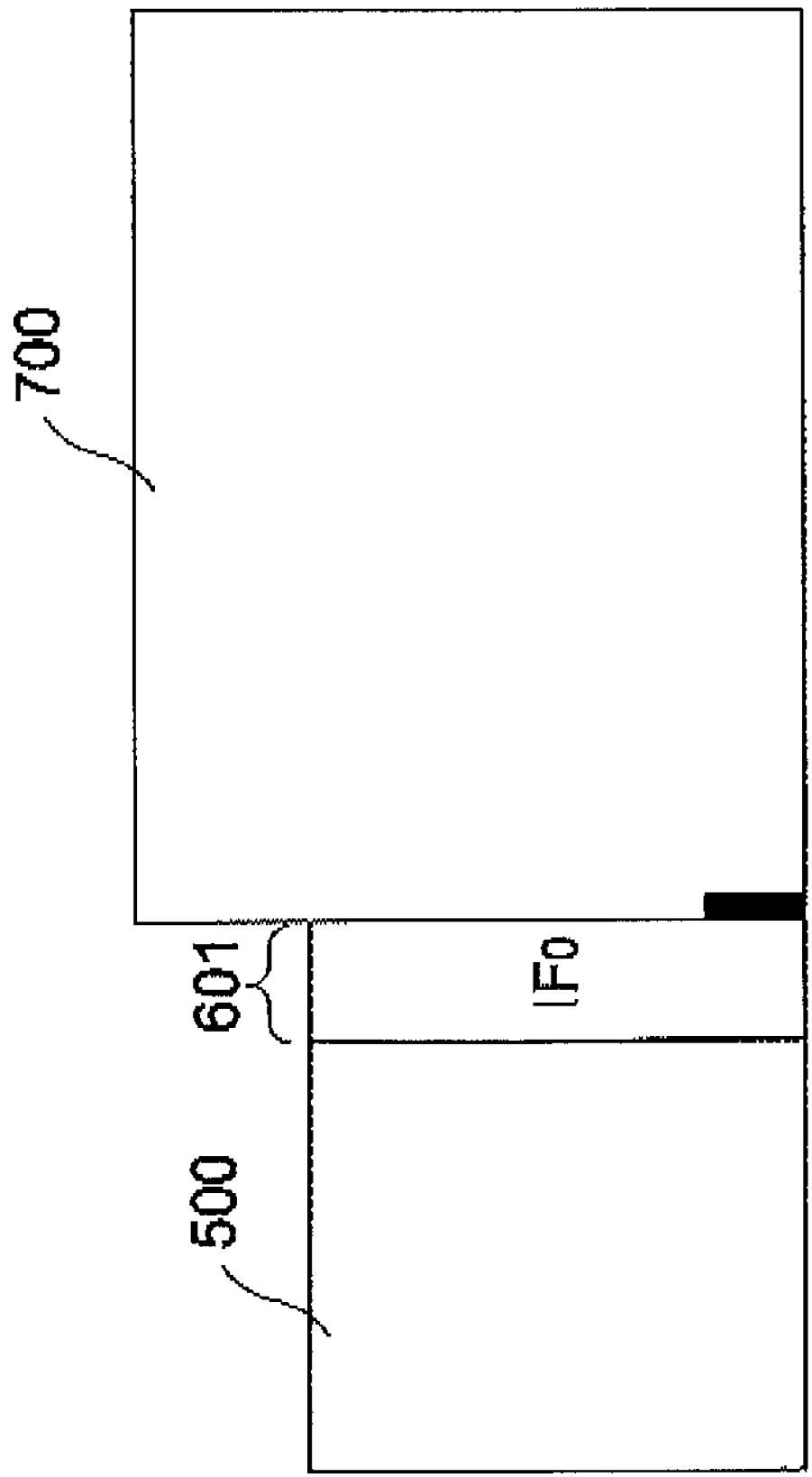
FIG. 9 is a schematic view for explaining a structure of lithography system according to a second comparative example.

On the other hand, FIG. 9 is a schematic view for explaining a structure of lithography system according to a second comparative example.

An interface 601 of this second comparative example is composed of one conveyance chamber $IF_0$ directly contacting an application and development apparatus 500 for performing the treatment under atmosphere pressure and an EUV exposure apparatus 700 for performing exposure treatment under high vacuum of, for example, $10^{-5}$ Pa.

This conveyance chamber $IF_0$ transfers the substrate under atmosphere pressure between the application and development apparatus 500 and the conveyance chamber $IF_0$, and transfers the substrate under high vacuum between the exposure apparatus 700 and the conveyance chamber $IF_0$, and therefore, it is necessary to control the degree of vacuum from the atmosphere pressure to the high degree of vacuum equal to the atmosphere inside the exposure apparatus 700.

In the case that throughput of the exposure in the EUV exposure apparatus 700 is desired to be maximum, the available time for controlling the degree of vacuum of the conveyance chamber $IF_0$ is $t_{exp}-t_0-t_{SR}$, in which $t_{exp}$ is exposure cycle time per substrate and $t_0$ is time required for transporting the substrate between the application and development apparatus 500 and $IF_0$ by $IF_0$ and $t_{SR}$ is time for transporting the substrate between the EUV exposure apparatus 700 and $IF_0$ by $IF_0$. That is, if the degree of vacuum of the conveyance chamber can be enhanced to a predetermined value in this time, the exposure in the EUV exposure apparatus 700 can be approximately continuously carried out.

However, in the second comparative example, it is necessary to exhaust from the atmosphere pressure to the high vacuum of the exposure atmosphere in the one conveyance chamber $IF_0$, and also, the substrate is repeatedly subjected to the atmosphere in the substrate transport between the application and development apparatus 500 and the $IF_0$. That is, it is not effective that the interface 601 of the first comparative example is used for the EUV exposure apparatus requiring high throughput of near 100 substrates (wafers) having a diameter of 300 mm per hour.

Figure 10:
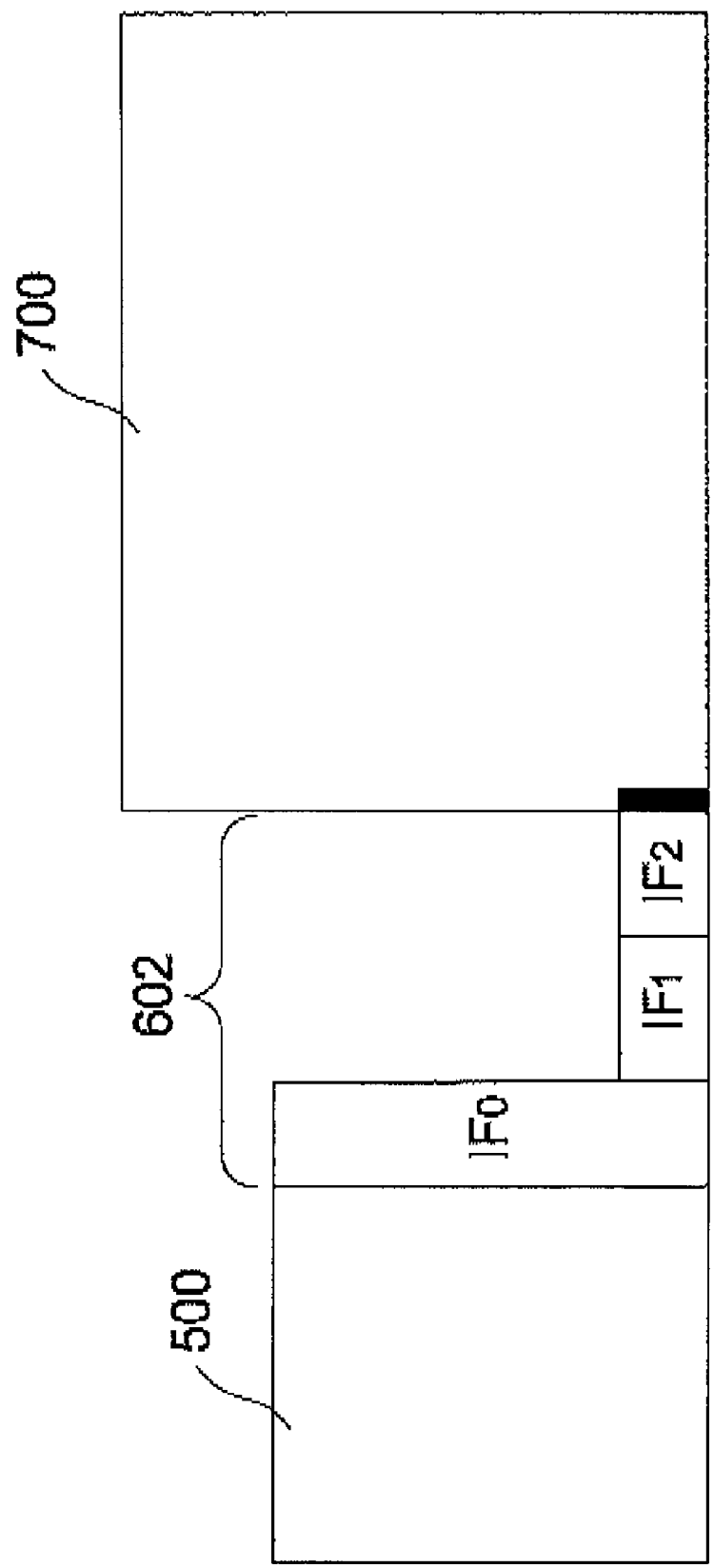
FIG. 10 is a schematic view for explaining a structure of lithography system according to a third comparative example.

FIG. 10 is a schematic view for explaining a structure of lithography system according to a third comparative example.

An interface 602 of the third comparative example is composed by serially arranging, $IF_0$ directly contacting the application and development apparatus 500, a conveyance chamber $IF_1$ contacting $IF_0$ and maintained to be low vacuum, and a conveyance chamber $IF_2$ controlled to be high degree of vacuum that is the same degree as the atmosphere inside the exposure apparatus 700. That is, the conveyance pathway controlled to be low pressure is composed of two conveyance chambers $IF_1$, $IF_2$ in which the degrees of vacuum are adjusted to two stages.

In each of the conveyance chambers, the degree of vacuum is controlled to the achievement degree of vacuum of the conveyance chamber from the degree of vacuum of the conveyance chamber having smaller suffix by one. Therefore, in the conveyance chamber $IF_1$ of low vacuum, the degree of vacuum is controlled from atmosphere pressure to low vacuum. And, in the conveyance chamber $IF_2$ of high vacuum, the degree of vacuum is controlled from the low vacuum to high vacuum that is equal to inside of the exposure apparatus, and therefore, the control of degree of vacuum becomes easier than that of the first comparative example.

Here, for suppressing fluctuation of the degree of vacuum of the exposure apparatus 700, it becomes necessary to enhance the control accuracy of the degree of vacuum of the conveyance chamber $IF_2$ held to be of high degree of vacuum.

Also, in the case that throughput of the exposure in the EUV exposure apparatus 700 is desired to be maximum, the available time for controlling the degree of vacuum of the conveyance chamber $IF_2$ is $t_{exp}$–$t_1$–$t_{SR}$, in which $t_{exp}$ is exposure cycle time per substrate and $t_1$ is time for transporting the substrate between the conveyance chambers $IF_1$ and $IF_2$ and $t_{SR}$ is time for transporting the substrate between the conveyance chamber $IF_2$ and the EUV exposure apparatus 700. That is, it is necessary to control the degree of vacuum of the conveyance chamber $IF_2$ in the time $t_{exp}$–$t_1$–$t_{SR}$.

In an EB direct exposure apparatus for carrying out exposure in vacuum in the same manner as the EUV exposure apparatus, the required throughput is, for example, 2 substrates per hour, which is low, and therefore, the interface 602 of the second comparative example can be used.

However, in the case of the EUV exposure apparatus requiring high throughput such as 100 substrates per hour, it is not easy to control the degree of vacuum of the conveyance chamber $IF_2$ from the control pressure of the conveyance chamber $IF_1$ of low degree of vacuum to the high degree of vacuum that is equal to the inside of the exposure apparatus 700 within the time $t_{exp}$–$t_1$–$t_{SR}$ in the interface 602.

By contrast, the interface 600 of the fourth embodiment shown in FIG. 8 is composed by serially arranging, the conveyance chamber $IF_0$ directly contacting the application and development apparatus 500 for performing the treatment under atmosphere pressure, a conveyance chamber (represented by $IF_1$) maintained to be of low vacuum that is composed of two pathways by two compartments $IF_{1a}$, $IF_{1b}$ arranged in parallel that contact $IF_0$ respectively, a conveyance chamber (represented by $IF_2$) maintained to be of higher vacuum than that of $IF_1$ that is composed of two pathways by two compartments $IF_{2a}$ (in the side contacting the $IF_{1a}$), $IF_{2b}$ (in the side contacting $IF_{1b}$) arranged in parallel, conveyance chamber(s) whose degree of vacuum is sequentially enhanced and whose number is n–3 each having two compartments (the conveyance chambers are represented by $IF_3$, $IF_4$, … $IF_{n-1}$ in order from the side of the application and development apparatus 500 and their compartments are represented by $IF_{3a}$, $IF_{3b}$, or the like), and a conveyance chamber $IF_n$ that is composed of two pathways by two compartments $IF_{na}$ (in the side contacting the $IF_{(n-1)a}$), $IF_{nb}$ (in the side contacting $IF_{(n-1)b}$) and that directly contacts the exposure apparatus 700 and that is controlled to be the degree of vacuum equal to the atmosphere inside the exposure apparatus 700.

That is, the conveyance pathway controlled to be low pressure is composed of n conveyance chambers whose degree of vacuum is adjusted by n stages, and these conveyance chambers $IF_1$-$IF_n$ compose two pathways of the conveyance pathway by compartments $IF_{1a}$-$IF_{na}$ and the conveyance pathway by compartments $IF_{1b}$-$IF_{nb}$. Here, $n \geq 3$.

In each of the conveyance chambers, the degree of vacuum is controlled to the achievement degree of vacuum of the conveyance chamber from the degree of vacuum of the conveyance chamber having smaller suffix by one. Therefore, the conveyance chamber $IF_1$ (compartments $IF_{1a}$, $IF_{1b}$) controls the degree of vacuum from the degree of vacuum of the conveyance chamber $IF_{i-1}$ in the application and development apparatus 500 side to the degree of vacuum of itself, and therefore, it becomes easy to control the degree of vacuum, compared to the second comparative example. Here, $1 \leq i \leq n$. However, i+1 is the exposure apparatus 700.

The interface 600 of the fourth embodiment is different from the interface 602 of the third comparative example (FIG. 10) in the point that at least a part of the interface, typically, a part thereof in the high vacuum side of the exposure apparatus 700 side is composed of a plurality of conveyance pathways. In FIG. 8, two conveyance pathways are composed, but three or more conveyance pathways can be composed.

The substrates are conveyed by being, for example, alternatively distributed from the conveyance chamber $IF_0$ to the conveyance pathway by the compartment $IF_{1a}$-$IF_{na}$ and to the conveyance pathway by the compartment $IF_{1b}$-$IF_{nb}$, and delivery and receipt of the substrates are, for example, alternatively performed between the exposure apparatus 700 and the compartment $IF_{na}$ directly contacting the apparatus and between the exposure apparatus 700 and the compartment $IF_{nb}$ directly contacting the apparatus.

As a result, in the case that the throughput of the EUV exposure apparatus 700 is made to be maximum, the available time for controlling the degree of vacuum in the conveyance chamber $IF_i$ (compartments $IF_{ia}$, $IF_{ib}$) composed by the plurality of pathways is $2t_{exp}$–$t_{i-1}$–$t_i$, in which $t_{exp}$ is exposure cycle time per substrate and $t_{i-1}$ is time for transporting the substrate between the conveyance chamber $IF_{i-1}$ (compartments $IF_{(i-1)a}$, $IF_{(i-1)b}$) of the application and development apparatus 500 side and the conveyance chamber $IF_i$ (compartments $IF_{ia}$, $IF_{ib}$) and $t_i$ is time for transporting the substrate between the conveyance chamber $IF_i$ (compartments $IF_{ia}$, $IF_{ib}$) and the conveyance chamber $IF_{i+1}$ (compartments $IF_{(i+1)a}$, $IF_{(i+1)b}$) of the exposure apparatus 700 side.

On the other hand, the available time for controlling the degree of vacuum of the conveyance chamber $IF_i$ in the case of one conveyance pathway is $t_{exp}$–$t_{i-1}$–$t_i$ in the same manner as explanation in the third comparative example (see, FIG. 10).

That is, by setting the conveyance pathway to be two, the available time for controlling the degree of vacuum of $IF_i$ increases by the exposure cycle time $t_{exp}$ with respect to one substrate, and it becomes possible to sufficiently adjust the degree of vacuum in the conveyance chamber $IF_i$ (compartments $IF_{ia}$, $IF_{ib}$). In the case of three conveyance pathways, the available time increases by the time $2t_{exp}$.

As a result, the control accuracy of the degree of vacuum of the conveyance chamber $IF_i$ (compartments $IF_{ia}$, $IF_{ib}$) can be enhanced, and the time for more approximating the degree of vacuum of the conveyance chamber $IF_n$ (compartments $IF_{na}$, $IF_{nb}$) in the most exposure apparatus 700 side to the degree of vacuum in the exposure apparatus 700 can be ensured.

Thereby, when the substrate is transported between the conveyance chamber $IF_n$ (compartments $IF_{na}$, $IF_{nb}$) and the exposure apparatus 700, lowering of the degree of vacuum inside the exposure apparatus 700 can be suppressed, and adjustment accuracy of the substrate and control accuracy of the focus position can be improved.

Moreover, along therewith, because inside temperature change inside the exposure apparatus 700 and residual gas such as moisture can be suppressed, active species generated by exciting the residual gas by EUV light can be suppressed to hold the atmosphere in the exposure apparatus to be clean.

And, eventually, this leads to improvement of performance and yield of semiconductor device produced by using the lithography system.

The conveyance chamber $IF_n$ (compartments $IF_{na}$, $IF_{nb}$) located in the most exposure apparatus 700 side can also be provided inside the exposure apparatus 700. Moreover, the conveyance chamber $IF_0$ located in the most application and development apparatus 500 side can be provided inside the application and the development apparatus 500. The apparatus in which the conveyance chamber $IF_n$ (compartments $IF_{na}$, $IF_{nb}$) is integrated to the exposure apparatus 700 or the apparatus in which the conveyance chamber $IF_0$ is integrated to the application and development apparatus 500 is a modified example of this embodiment.

In the application and development apparatus 500, the resist film that is a sensitive material is formed on the substrate. The method for forming the resist film is a method for spin-applying a photoresist, and after the application of the photoresist, a heating process is carried out. Before the formation of the resist film onto the substrate, formation of a hard mask layer or adhesion treatment such as HMDS treatment may be performed. Moreover, in the application of photoresist, (edge) back rinse treatment of the resist film or rinse treatment of the resist surface or the like may be performed. Moreover, after the formation of the resist film, a protective film may be formed or a surface treatment may be performed, on the resist surface.

WEE (Wafer Edge Exposure) process may be carried out as a part of the interface 600, desirably, as a structure of the lower vacuum side thereof. The WEE process is typically before the pattern exposure but may be after the pattern exposure.

The substrate on which the resist film is formed is conveyed from the application and development apparatus 500 into the exposure apparatus 700 through the conveyance pathway by $IF_0, IF_{1a} \ldots IF_{na}$ of the interface 600 or through the conveyance pathway by $IF_0/IF_{1b} \ldots IF_{nb}$ thereof. In the exposure apparatus 700, the pattern formed on a reflection-type mask is subjected to reduced projection by a reflection mirror. The substrate subjected to the pattern exposure is conveyed from the exposure apparatus 700 into the application and development apparatus 500 again through the conveyance pathway by $IF_{na} \ldots IF_{1a}, IF_0$ of the interface 600 or through the conveyance pathway by $IF_{nb} \ldots IF_{1b}, IF_0$ thereof.

In the application and development apparatus 500, the substrate subjected to the pattern exposure is subjected to heating (Post Exposure Bake) process according to need, and then, subjected to development treatment by 2.38% by weight of a TMAH development solution and to rinse process for removing the development solution. The post-development rinse process may be performed not only by rinse with pure water but also by rinse with a rinse solution containing a detergent that is known as FIRM treatment. Moreover, in the case of forming a protective film on the resist film before the exposure, a process of removing the protective film may be carried out according to need.

According to the fourth embodiment described above, by the conveyance pathway in which the plurality of conveyance chambers whose degree of vacuum is composed of many stages are further composed of the plurality of compartments, the substrates are distributed and conveyed to the EUV exposure apparatus, and thereby, the pressure fluctuation in the EUV exposure apparatus can be reduced, and therewith, the cleanup state can be held.

Fifth Embodiment

Figure 11:
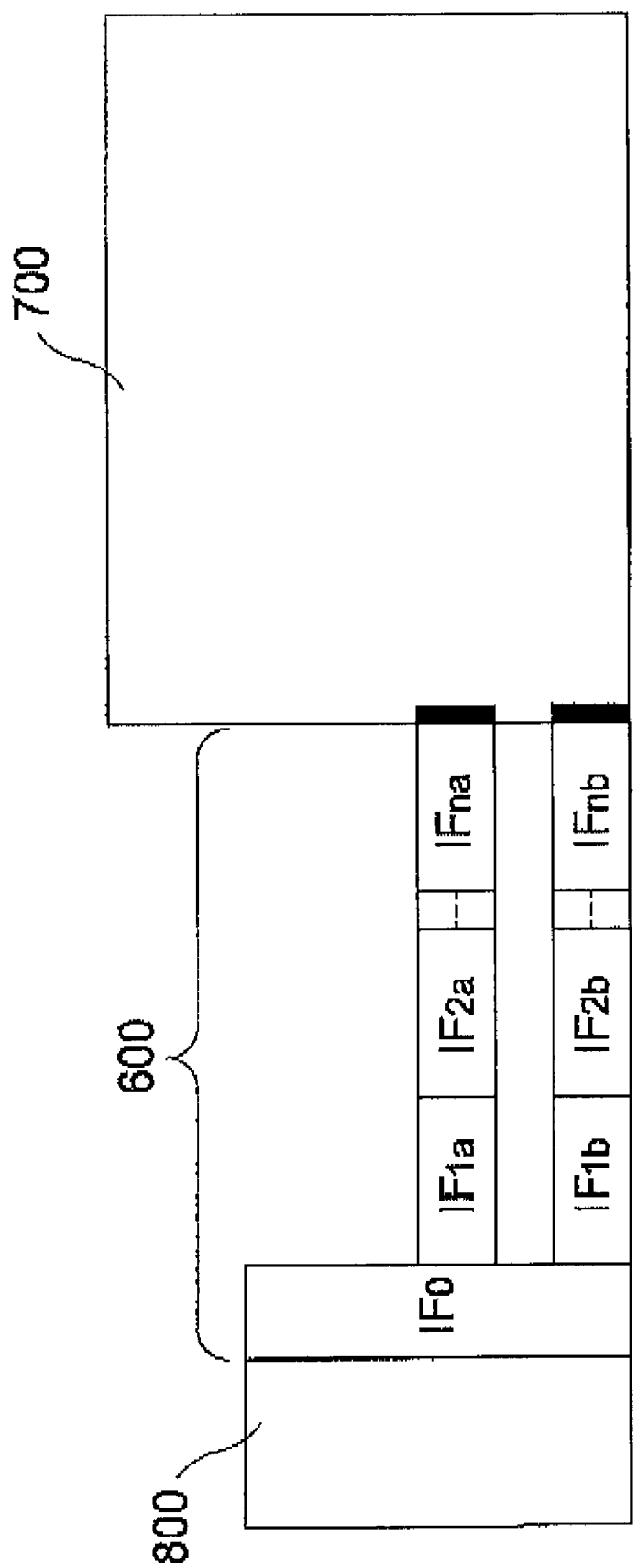
FIG. 11 is a schematic view for explaining a structure of a lithography system according to a fifth embodiment of the invention.

FIG. 11 is a schematic view for explaining a structure of a lithography system according to the fifth embodiment of the invention.

In the lithography system of FIG. 11, the application and development apparatus 500 is replaced by a load port (wafer load port) 800 in the above-described lithography system of the fourth embodiment.

In the fourth embodiment, the system is composed by using the application and development apparatus 500, and there has been explained the lithography system in which a line of lithography processes of, at least, the resist-applying step, the heating step of the resist (pre-exposure bake step or post-exposure bake (PEB)), and development treatment is carried out as well as the exposure step.

By contrast, as shown in FIG. 11, even when the application and the development apparatus 500 is replaced by the wafer load port 800 for the substrates on which resist films are formed, it is obvious that the same effect as the first embodiment can be obtained with respect to the exposure apparatus.

Sixth Embodiment

Figure 12:
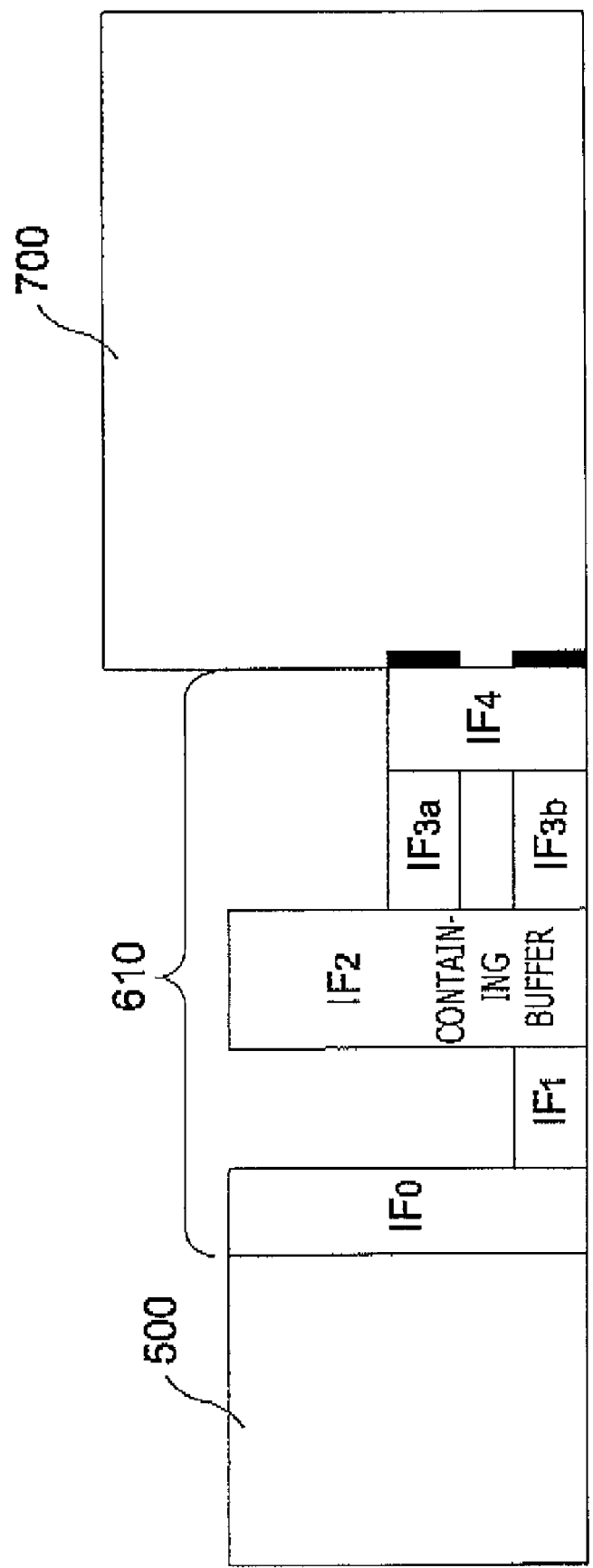
FIG. 12 is a schematic view for explaining a structure of a lithography system according to a sixth embodiment of the invention.

FIG. 12 is a schematic view for explaining a structure of a lithography system according to the sixth embodiment of the invention.

An interface 610 of FIG. 12 is composed by serially arranging, the conveyance chamber $IF_0$ of atmosphere pressure, a conveyance chamber $IF_1$ of low degree of vacuum, a conveyance chamber $IF_2$ of middle degree of vacuum having a buffer of substrate (wafer), a conveyance chamber (represented by $IF_3$) of high degree of vacuum composed of two pathways by two compartment $IF_{3a}, IF_{3b}$ arranged in parallel, and a conveyance chamber $IF_4$ of high degree of vacuum to which the two pathways flow into each other and which directly transports a substrate between the exposure apparatus 700 and the conveyance chamber $IF_4$.

The interface 610 is an example of the case of one transport part for the substrate between the exposure apparatus 700 and the pathway. Moreover, the conveyance pathway controlled to be low pressure is composed of four conveyance chambers $IF_1$-$IF_4$ whose degree of vacuum is adjusted to be four stages.

Because the conveyance chamber $IF_3$ (compartments $IF_{3a}, IF_{3b}$) is composed of two pathways, the controllable time of the degree of vacuum can be longer than that of the case of one pathway, and thereby, the accuracy of the control of degree of vacuum of the compartments $IF_{3a}, IF_{3b}$ can be enhanced. Moreover, after the conveyance chamber $IF_3$ (compartments $IF_{3a}, IF_{3b}$), there is the conveyance chamber $IF_4$ held to be higher vacuum, but it is thought that by improvement of the control accuracy of degree of vacuum of the conveyance chamber $IF_3$, the accuracy that the conveyance chamber $IF_4$ is held to be high vacuum is also enhanced, and therefore, fluctuation of degree of vacuum inside the exposure apparatus 700 along with transport of the substrate between the interface 610 and the exposure apparatus 700 can be suppressed to be minimum.

Moreover, in the conveyance chamber $IF_2$ of middle degree of vacuum having a buffer, effect of removing moisture or the like attaching to the substrate can be expected because the degree of vacuum comes to lower only to low degree of vacuum even in the transport of wafer (substrate) between the conveyance chamber $IF_1$ of low degree of vacuum and the $IF_2$.

Seventh Embodiment

Figure 13:
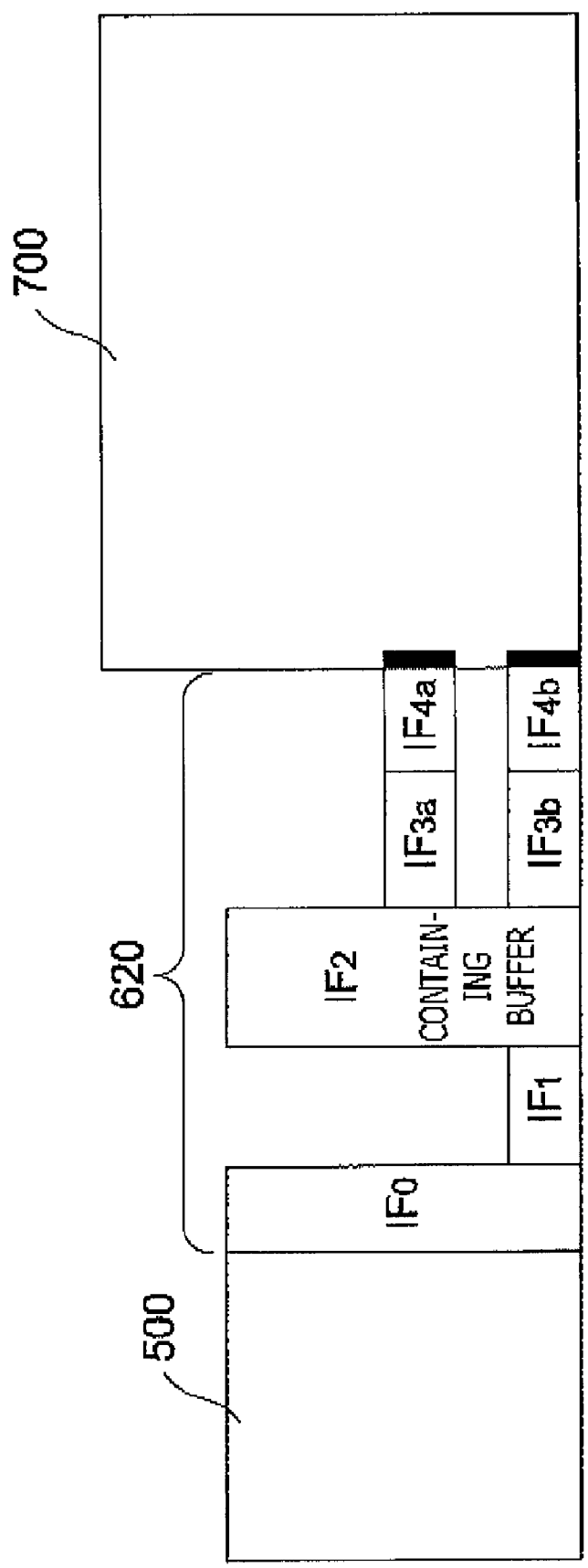
FIG. 13 is a schematic view for explaining a structure of a lithography system according to a seventh embodiment of the invention.

FIG. 13 is a schematic view for explaining a structure of a lithography system according to the seventh embodiment of the invention.

An interface 620 of FIG. 13 is composed by serially arranging, the conveyance chamber $IF_0$ of atmosphere pressure, the conveyance chamber $IF_1$ of low degree of vacuum, the conveyance chamber $IF_2$ of middle degree of vacuum having a buffer of wafer, the conveyance chamber (represented by $IF_3$) of high degree of vacuum composed of two pathways by two compartment $IF_{3a}, IF_{3b}$ arranged in parallel, and the conveyance chamber (represented by $IF_4$) of high degree of vacuum for directly transporting the substrate between the exposure apparatus 700 and the $IF_4$ through each of two pathways by two compartment $IF_{4a}$, (in the side contacting the $IF_{3a}$) $IF_{4b}$ (in the side contacting the $IF_{3b}$) arranged in parallel.

The interface 620 is an example of the case of two transport parts for the substrate between the exposure apparatus 700 and the pathway. Moreover, the conveyance pathway controlled to be low pressure is composed of four conveyance chambers $IF_1$-$IF_4$ whose degree of vacuum is adjusted to be four stages.

Because the conveyance chambers $IF_3$ and $IF_4$ are composed of two pathways of the pathway by the compartments $IF_{3a}$, $IF_{4a}$ and the pathway by the compartments $IF_{3b}$, $IF_{4b}$, the controllable time of the degree of vacuum can be longer than that of the case of one pathway. Thereby, the accuracy of the control of degree of vacuum of the conveyance chamber $IF_4$ (compartments $IF_{4a}$, $IF_{4b}$) controlled to be of degree of vacuum equal to the inside of the exposure apparatus 700 can be improved, and therefore, fluctuation of degree of vacuum inside the exposure apparatus 700 along with transport of the substrate between the interface 620 and the exposure apparatus 700 can be suppressed to be minimum.

Moreover, in the conveyance chamber $IF_2$ of middle degree of vacuum having a buffer, effect of removing moisture or the like attaching to the substrate can be expected because the degree of vacuum comes to lower only to low degree of vacuum even in the transport of wafer (substrate) between the conveyance chamber $IF_1$ of low degree of vacuum and the $IF_2$.

Eighth Embodiment

Figure 14:
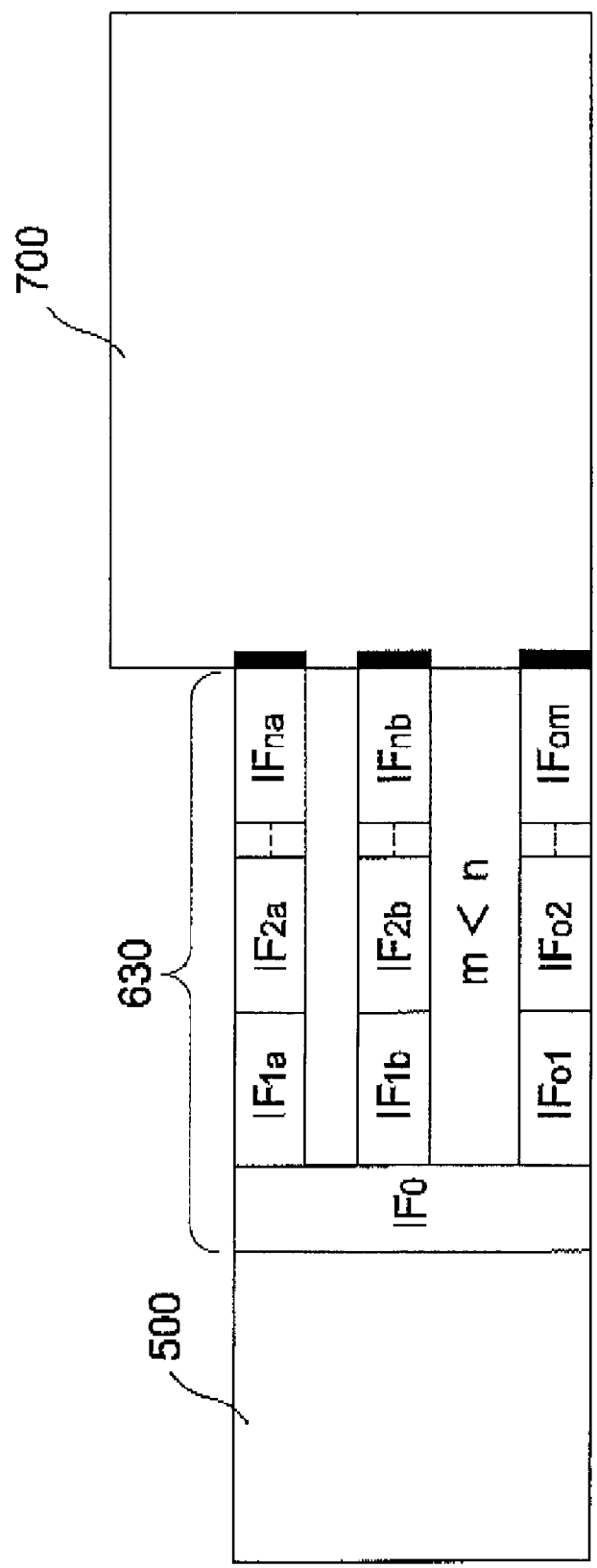
FIG. 14 is a schematic view for explaining a structure of a lithography system according to an eighth embodiment of the invention.

FIG. 14 is a schematic view for explaining a structure of a lithography system according to the eighth embodiment of the invention.

In an interface 630 of FIG. 14, the conveyance pathway $IF_0$, $IF_{1a}$, $IF_{2a}$, ..., $IF_{na}$, and $IF_0$, $IF_{1b}$, $IF_{2b}$, ..., $IF_{nb}$ are used as the transport pathway (carry-in pathway) for the substrate before the exposure, and as a transport pathway (carry-out pathway) for the substrate after the pattern exposure other than the carry-in pathway, the conveyance chamber $IF_0$ and carry-out chambers $IF_{o1}$, $IF_{o2}$, ..., $IF_{om}$ (m<n) are serially arranged.

The carry-out chamber of the high vacuum side in the exposure apparatus 700 side is $IF_{om}$, and the lower vacuum side is $IF_{o(m-1)}$, and sequentially, carry-out chambers are provided according to need, and the lower vacuum side is $IF_{o1}$, and the atmosphere pressure side is $IF_0$.

By the structure in which the carry-out pathway whose degree of vacuum is controlled to be many stages is provided other than the carry-in pathway of the substrate as described above, the lapse time of the substrate after the pattern exposure (Post Exposure Delay) can be reduced.

One specific example in which this embodiment exerts the effect is the case that the number of the conveyance chambers (carry-in chambers) serially arranged is large in the substrate carry-in side (side of carrying the substrate into the exposure apparatus 700 from the application and development apparatus 500) and a plurality of conveyance chambers having little difference of the degree of vacuum to be controlled are provided for buffer mechanisms or monitor mechanisms for the wafer (substrate). That is, in such a case, according to this embodiment, without passing through the plurality of conveyance chambers provided in the carry-in pathway, the exposed wafer can be rapidly taken out through the special conveyance chambers provided in the carry-out side.

Ninth Embodiment

In a ninth embodiment, in the above-described fourth to eighth embodiments, mechanisms for maintaining the atmosphere in the conveyance chamber $IF_n$ (compartments $IF_{na}$, $IF_{nb}$) and $IF_4$ and the carry-out chamber $IF_{om}$ that directly transport the substrate between the exposure apparatus 700 and each of the chambers to be approximately equal to the inside of the exposure apparatus 700 is provided. Thereby, fluctuation or the like of the degree of vacuum or the temperature inside the exposure apparatus 700 can be suppressed in the case that the degree of vacuum or the partial pressure is different.

In particular, the residual moisture (partial pressure of moisture vapor) becomes a factor of raising the partial pressure of the residual moisture gas inside the exposure 700, and therefore, is maintained to be approximately equal to the inside of the exposure apparatus 700, or mechanisms for further lowering the moisture vapor partial pressure (maintaining the low-humidity atmosphere) may be provided.

In the above-described sixth to ninth embodiments, the application and development apparatus 500 can be replaced by the load port 800 of the fifth embodiment. Furthermore, the interfaces according to the fourth to ninth embodiments can be applied to the interface 300 of the first to third embodiments.

Moreover, in each of the embodiments, examples of the case of the EUV exposure is explained, but the embodiments can be applied to another lithography system for carrying out the pattern exposure in high vacuum such as a method that neutron radiation or molecular line is set to be a patterned radiation although this is not realistic at this time.

As described above, the embodiments of this invention have been explained with reference to drawings.

However, this invention is not limited to these embodiments, but the specific examples thereof can be appropriately modified in the range that is not departed from the spirit of this invention.

Moreover, it goes without saying that by using this invention, wiring of the semiconductor device is formed or a gate of MOS transistor is formed, and thereby, various semiconductor devices can be produced.

Figure 15:
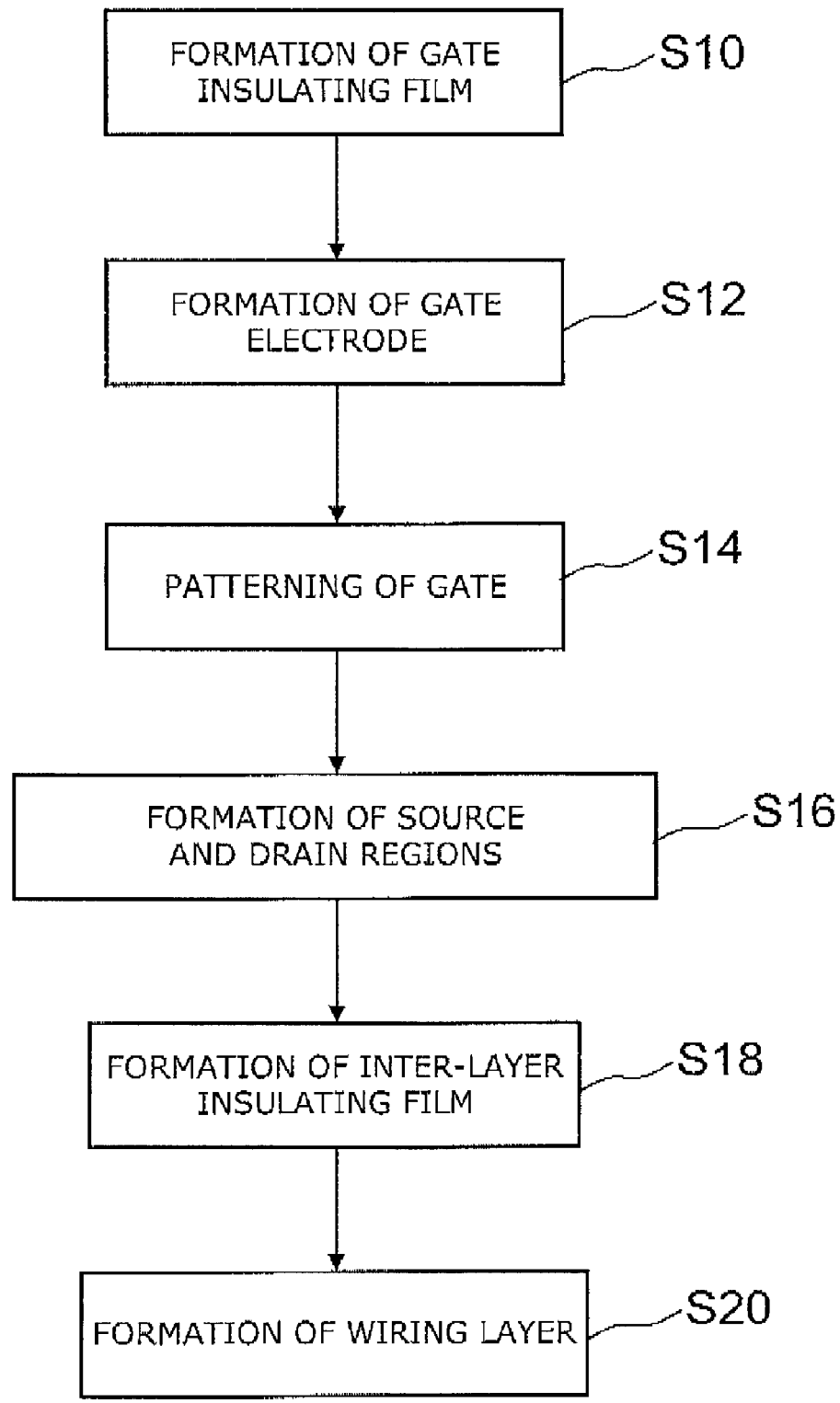
FIG. 15 is a flow chart illustrating a part of a production process of the semiconductor device.

FIG. 15 is a flow chart illustrating a part of a production process of the semiconductor device. That is, this figure illustrates a production process of a transistor.

In producing a transistor, first a gate insulating film is formed on a wafer such as silicon (Step S10). And, a conductive material to be a gate electrode is formed (Step S12). Then, a predetermined mask is formed and the gate electrode and the gate insulating film are patterned (Step S14). In the step of patterning, the method for treating a substrate, the method for conveying a substrate, or the apparatus for conveying a substrate of the embodiments can be used. That is, in patterning the gate electrode and the gate insulating film, the resist to be a mask is applied onto the gate electrode, and exposure is performed through a predetermined mask, and then, the resist is developed. In this case, by using the method for treating a substrate of the embodiments, or by using the method for conveying a substrate or the apparatus for conveying a substrate of the embodiments, the patterning can be smoothly carried out with holding the cleanup state in the exposure apparatus.

Then, by introducing impurities to the wafer so that the patterned gate serves as a mask, source and drain regions are formed (Step S16). And, an inter-layer insulating film is formed on the wafer (Step S18), and furthermore, a wiring layer is formed (Step S20), and thereby, a substantial part of the transistor is accomplished. Here, also in forming a via-hole in the inter-layer insulating film or in patterning a wiring layer, the method for treating a substrate or the method for conveying a substrate or the apparatus for conveying a substrate of the embodiments can be used.

The invention claimed is:

1. A method for treating a substrate before exposing the substrate to which a resist is applied, comprising:

rinsing the substrate to which a resist is applied;

holding the rinsed substrate in an atmosphere substantially containing no moisture until conveying the substrate to an exposure apparatus; and conveying the substrate into the exposure apparatus via a conveyance pathway composed by serially connecting a plurality of conveyance chambers so that degree of vacuum becomes high in a stepwise manner to the exposure apparatus side, at least a part of the conveyance pathway to the exposure apparatus including a plurality of pathways by setting at least one of the plurality of conveyance chambers to be a plurality of compartments arranged in parallel, and thereby, the substrates being distributed through the plurality of pathways and thereby conveyed.

2. The method according to claim 1, wherein three or more conveyance chambers are serially arranged in the conveyance pathway for carrying the substrate into the exposure apparatus.

3. The method according to claim 1, wherein in the conveyance pathway includes a plurality of pathway which are connected to the exposure apparatus.

4. The method according to claim 1, wherein delivery and receipt of the substrate are alternatively performed between the exposure apparatus and the conveyance pathway which directly connected to the exposure apparatus.

5. The method according to claim 1, wherein at least a part of the conveyance chamber is provided inside the exposure apparatus.

6. The method according to claim 1, wherein all of the plurality of conveyance chambers are arranged in parallel, and all of the conveyance pathway to the exposure apparatus is made into a plurality of parallel pathways.

7. The method according to claim 1, wherein the conveyance pathway is connected to an application and development apparatus on a side which is opposite to the exposure apparatus, and the application and development apparatus performs a formation of the resist film and a development of the resist.

8. The method according to claim 7, wherein at least a part of the conveyance chamber is provided inside the application and development apparatus.

9. The method according to claim 1, wherein the conveyance pathway is connected to a wafer load port on a side which is opposite to the exposure apparatus.

10. The method according to claim 1, wherein at least a part of the conveyance chamber has a buffer of the substrate.

11. The method according to claim 10, wherein in the conveyance pathway includes a plurality of pathway which are connected to the exposure apparatus.

12. The method according to claim 1, wherein a part of the conveyance pathway is used for conveying the substrate before exposure, and other part of the conveyance pathway is used for conveying the substrate after exposure.

13. The method according to claim 1, wherein an atmosphere in the conveyance chamber which is directly connected to the exposure apparatus is maintained substantially same as an atmosphere in the exposure apparatus.

14. The method according to claim 1, wherein a partial pressure of water in the conveyance chamber which is directly connected to the exposure apparatus is maintained substantially same as or lower than a partial pressure of water in the exposure apparatus.

15. A substrate-conveying apparatus having a conveyance pathway connected to an exposure apparatus, wherein the conveyance pathway for carrying the substrate into the exposure apparatus in the conveyance pathway is composed by serially connecting a plurality of conveyance chambers in which degree of vacuum becomes high in a stepwise manner to the exposure apparatus side, and at least a part of the conveyance pathway to the exposure apparatus is a plurality of pathways by setting at least one of the plurality of conveyance chambers to be a plurality of compartments arranged in parallel.

16. The apparatus according to claim 15, wherein three or more conveyance chambers are serially arranged in the conveyance pathway for carrying the substrate into the exposure apparatus.

17. The apparatus according to claim 15, wherein an atmosphere in the conveyance chamber which is directly connected to the exposure apparatus is maintained substantially same as an atmosphere in the exposure apparatus.

* * * * *